(12) United States Patent
Furue et al.

(10) Patent No.: US 10,866,512 B2
(45) Date of Patent: Dec. 15, 2020

(54) POSITIVE PHOTOSENSITIVE RESIN COMPOSITION

(71) Applicant: SHOWA DENKO K.K., Tokyo (JP)

(72) Inventors: Kentaro Furue, Tokyo (JP); Yuki Miyaishi, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 248 days.

(21) Appl. No.: 15/755,336

(22) PCT Filed: Oct. 19, 2016

(86) PCT No.: PCT/JP2016/081012
§ 371 (c)(1),
(2) Date: Feb. 26, 2018

(87) PCT Pub. No.: WO2017/069172
PCT Pub. Date: Apr. 27, 2017

(65) Prior Publication Data
US 2018/0253003 A1  Sep. 6, 2018

(30) Foreign Application Priority Data

Oct. 21, 2015  (JP) .................................. 2015-207057

(51) Int. Cl.

| | | |
|---|---|---|
| G03F 7/023 | (2006.01) | |
| G03F 7/105 | (2006.01) | |
| H01L 51/50 | (2006.01) | |
| H05B 33/10 | (2006.01) | |
| H05B 33/22 | (2006.01) | |
| G03F 7/039 | (2006.01) | |
| H01L 27/32 | (2006.01) | |
| G03F 7/038 | (2006.01) | |

(52) U.S. Cl.
CPC .......... *G03F 7/0236* (2013.01); *G03F 7/0233* (2013.01); *G03F 7/0392* (2013.01); *G03F 7/105* (2013.01); *H01L 51/50* (2013.01); *H05B 33/10* (2013.01); *H05B 33/22* (2013.01); *G03F 7/0388* (2013.01); *H01L 27/3246* (2013.01); *H01L 27/3283* (2013.01)

(58) Field of Classification Search
CPC ............................................. G03F 7/022–0236
See application file for complete search history.

(56) References Cited

U.S. PATENT DOCUMENTS

| | | | |
|---|---|---|---|
| 4,299,906 A | 11/1981 | Liu | |
| 4,307,173 A | 12/1981 | Gventer | |
| 2013/0164461 A1 | 6/2013 | Chen et al. | |
| 2013/0306970 A1 | 11/2013 | Chen et al. | |
| 2014/0065526 A1* | 3/2014 | Chen ...................... | G03F 7/022 |
| | | | 430/18 |

FOREIGN PATENT DOCUMENTS

| | | |
|---|---|---|
| CN | 103176364 A | 6/2013 |
| JP | 56-19055 A | 2/1981 |
| JP | 2002-116536 A | 4/2002 |
| JP | 2007-156243 A | 6/2007 |
| JP | 2007-256646 A | 10/2007 |
| JP | 2010-237310 A | 10/2010 |
| JP | 2011-209692 A | 10/2011 |
| JP | 2014-137523 A | 7/2014 |
| JP | 2015-145912 A | 8/2015 |
| KR | 10-2015-0036548 A | 4/2015 |
| TW | 201348878 A | 12/2013 |
| WO | 2016024425 A1 | 2/2016 |

OTHER PUBLICATIONS

SciFinder database Solvent Black listings of CAS registry Numbers and C.I. Solvent Black dyes 27 to 47, downloaded Dec. 21, American Chemical Society, 19 pages. (Year: 2019).*
Application Note, HunterLab, "CIE L*a*b* Color Scale" from Insight in Color, Jul. 1-15, 1996, vol. 8, No. 7,1996, copyright HunterLab, 4 pages. (Year: 1996).*
Application Note, HunterLab, "Hunter Lab Color Scale" from Insight in Color, Aug. 1-15, 1996, vol. 8, No. 9,1996, copyright HunterLab, 4 pages. (Year: 1996).*
International Search Report for PCT/JP2016/081012 dated Jan. 24, 2017 [PCT/ISA/210].

* cited by examiner

*Primary Examiner* — Cynthia Hamilton
(74) *Attorney, Agent, or Firm* — Sughrue Mion, PLLC

(57) ABSTRACT

Provided is a positive photosensitive resin composition having high sensitivity, high definition, and high adhesiveness and being capable of maintaining blackness and high light-blocking properties, even after a high-temperature curing step, e.g., at 250° C. This positive photosensitive resin composition contains: a binder resin (A); a quinonediazide compound (B); and at least one type of black dye (C) selected from black dyes specified by the color indexes of solvent black 27-47. The black dye (C) is ideally specified by the color index of solvent black 27, 29, or 34. This composition is capable of being suitably used in positive radiation lithography and can be used to form organic EL element partitions and insulating films.

19 Claims, No Drawings

POSITIVE PHOTOSENSITIVE RESIN COMPOSITION

CROSS REFERENCE TO RELATED APPLICATIONS

This application is a National Stage of International Application No. PCT/JP2016/081012, filed on Oct. 19, 2016, which claims priority from Japanese Patent Application No. 2015-207057, filed on Oct. 21, 2015.

TECHNICAL FIELD

The present invention relates to a positive photosensitive resin composition. In particular, the present invention relates to a black positive photosensitive resin composition, and a barrier rib and an insulating film of an organic EL display element using the same.

BACKGROUND ART

For display units such as organic EL displays (OLEDs), a barrier rib material is used for a gap portion between coloring patterns, edges of an area surrounding a display region, and the like in a display region in order to improve display properties. Upon production of an organic EL display unit, barrier ribs are formed for preventing pixels of an organic substance from coming into contact with each other, and then, pixels of an organic substance are formed between the barrier ribs. These barrier ribs are usually formed by photolithography using a photosensitive resin composition. Specifically, a substrate is coated with a photosensitive resin composition using a coater, a volatile component is removed by means of heating or the like, the substrate is exposed to light via a mask, and then, in the case of a negative photosensitive resin composition, an unexposed portion, or in the case of a positive photosensitive resin composition, an exposed portion is removed using a developer such as an aqueous alkaline solution for development. The obtained pattern is heat-treated, thereby forming barrier ribs. Subsequently, a film of an organic substance that emits three colors, i.e., red, green, and blue, is formed between the barrier ribs by an ink-jet method or the like, thereby forming pixels of an organic EL display unit.

In recent years, as a result of downsizing of display units and diversification of contents to be displayed in display units, there is a demand to realize high-performance and high-definition pixels. In addition, in order to increase contrast in a display unit so as to improve visibility, there have been attempts to allow a barrier rib material to have the light shielding function using a coloring agent. In addition, if a barrier rib material has low sensitivity, it causes the exposure time to be extended, resulting in reduction of productivity. Therefore, it is important to realize a barrier rib material having high sensitivity. Further, in order to respond to the demand to realize high-definition pixels, it is required to achieve an excellent pattern shape for a narrow pitch pattern and to allow a colored barrier rib material to have a darker black-like color in order to improve visibility. Moreover, since a formed barrier rib material is treated in various steps, it is necessary for the barrier rib material to have excellent thermostability so as not to affect surrounding materials.

For example, Japanese Unexamined Patent Publication No. 2002-116536 (hereinafter referred to as "Patent literature 1") proposes a method of coloring a barrier rib material with a pigment. However, radiation-sensitive resin compositions disclosed therein are problematic in that pigment particles are likely to remain as residues, which might affect RGB elements or surrounding materials.

Meanwhile, an example of a high-resolution radiation-sensitive resin composition that exhibits a high-level light shielding function as a result of heat treatment after exposure is a composition prepared by adding a heat-sensitive dye to a positive radiation-sensitive resin composition comprising an alkali-soluble resin and a quinonediazide compound such as one disclosed in Japanese Unexamined Patent Publication No. 2010-237310 (hereinafter referred to as "Patent literature 2"). In such positive radiation-sensitive resin composition, an unreacted heat-sensitive dye is not colored before exposure, and thus, the resin composition itself does not have the light shielding function, thereby preventing radiation sensitivity from deteriorating. This allows formation of a high-definition pattern, and heat treatment after exposure allows a heat-sensitive dye to react so as to exhibit the improved light shielding function. However, Patent literature 2 merely describes total light transmittance regarding the light shielding function and does not contain the description about hue. The heat-sensitive dye used in Patent literature 2 has a high-level light shielding function after heating; however, it does not have a black color. This largely affects surrounding materials of an actual panel in terms of hue, which may cause deterioration in image quality.

CITATION LIST

Patent Literature

Patent literature 1: Japanese Unexamined Patent Publication No. 2002-116536
Patent literature 2: Japanese Unexamined Patent Publication No. 2010-237310

SUMMARY OF INVENTION

Technical Problem

The temperature required for formation of a pattern, barrier ribs, or an insulating film of an organic EL display element is usually around 200° C. However, there has been no known positive photosensitive resin composition having high definition, high sensitivity, and high adhesiveness, which can maintain its black color when heated/baked to about 200° C. The present invention has been made based on the above-described circumstances. An object of the present invention is to provide a positive photosensitive resin composition having high sensitivity, high definition, and high adhesiveness, which can maintain its black color and high-level light shielding function even after treated in a step of high-temperature curing at about 250° C.

Solution to Problem

As a result of intensive studies, the present inventors found that a black resin composition containing a binder resin, a quinonediazide compound, and a black dye specified by Colour Index of Solvent Black 27 to 47 can maintain its black color and high-level light shielding function even after treated in a step of high-temperature curing at about 250° C. The present inventors also found that the black resin composition can maintain high sensitivity in terms of pattern formation by a photolithography method, and at the same time, can maintain its black color and high-level light shielding function after baking for pattern formation, and has a good resolution, film-remaining ratio, and the like. The present inventors further found that use of a polyalkenyl phenol resin, a polyhydroxy styrene resin derivative, or the like as a binder resin impart high thermostability to the black resin composition.

In other words, the present invention encompasses the following embodiments.

[1] A positive photosensitive resin composition comprising a binder resin (A), a quinonediazide compound (B), and at least one black dye (C) selected from black dyes specified by Colour Index of Solvent Black 27 to 47.

[2] The positive photosensitive resin composition according to [1], wherein the black dye (C) is specified by Colour Index of Solvent Black 27, 29, or 34.

[3] The positive photosensitive resin composition according to [1] or [2], comprising from 40 to 85 parts by weight of the binder resin (A), from 5 to 45 parts by weight of the quinonediazide compound (B), and from 0.1 to 50 parts by weight of the black dye (C), based on 100 parts by weight in total of the binder resin (A), the quinonediazide compound (B), and the black dye (C).

[4] The positive photosensitive resin composition according to any one of [1] to [3], wherein a cured product of the positive photosensitive resin composition has a hue which corresponds to an L* value of not more than 75, an a* value of −15 to 15, and a b* value of −15 to 15 in the L*a*b* color system.

[5] The positive photosensitive resin composition according to any one of [1] to [4], wherein the binder resin (A) has at least one alkali-soluble functional group in its molecule.

[6] The positive photosensitive resin composition according to any one of [1] to [5], wherein the binder resin (A) comprises at least one selected from the group consisting of (a) a polyalkenyl phenol resin having a structure represented by formula (1):

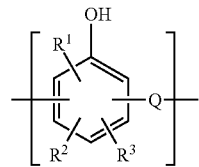

(1)

wherein $R^1$, $R^2$ and $R^3$ each independently represent a hydrogen atom or a $C_{1-5}$ alkyl group, an alkenyl group represented by formula (2):

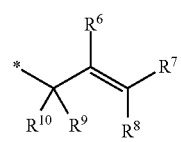

(2)

wherein $R^6$, $R^7$, $R^8$, $R^9$, and $R^{10}$ each independently represent a hydrogen atom, a $C_{1-5}$ alkyl group, a $C_{5-10}$ cycloalkyl group, or $C_{6-12}$ aryl group, and a symbol * in formula (2) represents a bond with a carbon atom that constitutes an aromatic ring, a $C_{1-2}$ alkoxy group, or a hydroxyl group, at least one of $R^1$, $R^2$ and $R^3$ is an alkenyl group represented by formula (2), and Q represents an alkylene group represented by —$CR^4R^5$—, a $C_{5-10}$ cycloalkylene group, a divalent organic group having an aromatic ring, a divalent organic group having an alicyclic condensed ring, or a divalent group of any combination thereof, wherein $R^4$ and $R^5$ each independently represent a hydrogen atom, a $C_{1-5}$ alkyl group, a $C_{2-6}$ alkenyl group, a $C_{5-10}$ cycloalkyl group, or a $C_{6-12}$ aryl group;

(b) a hydroxy polystyrene resin derivative having a structural unit represented by formula (3):

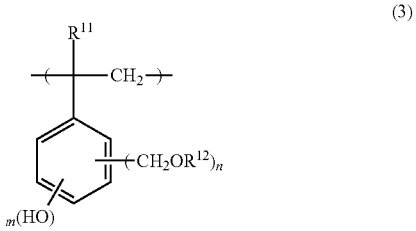

(3)

wherein $R^{11}$ represents a hydrogen atom or a $C_{1-5}$ alkyl group, m represents an integer of 1 to 4, n represents an integer of 1 to 4, m+n is from 2 to 5, $R^{12}$ represents at least one selected from the group consisting of a hydrogen atom, a methyl group, an ethyl group, and a propyl group;

(c) an aqueous alkaline solution-soluble resin having an epoxy group and a phenolic hydroxyl group; and (d) an aqueous alkaline solution-soluble copolymer of a polymerizable monomer having an alkali-soluble functional group and another polymerizable monomer.

[7] The positive photosensitive resin composition according to [6], wherein the binder resin (A) comprises at least one selected from the group consisting of the polyalkenyl phenol resin (a), the hydroxy polystyrene resin derivative (b), and the aqueous alkaline solution-soluble resin (c) having an epoxy group and a phenolic hydroxyl group.

[8] The positive photosensitive resin composition according to [6] or [7], wherein Q in formula (1) is —$CH_2$— for the polyalkenyl phenol resin (a), which means that formula (1) corresponds to formula (4):

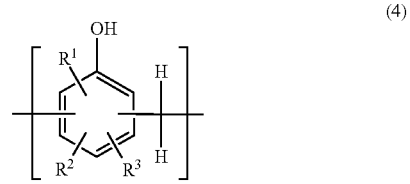

(4)

wherein $R^1$, $R^2$ and $R^3$ are the same as in formula (1).

[9] The positive photosensitive resin composition according to any one of [6] to [8], wherein the alkenyl group represented by formula (2) is an allyl group.

[10] The positive photosensitive resin composition according to any one of [6] to [9], wherein the hydroxy polystyrene resin derivative (b) is a copolymer having a structural unit represented by formula (3) and a structural unit represented by formula (5):

(5)

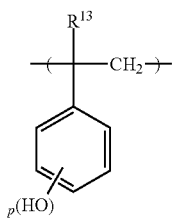

wherein $R^{13}$ represents a hydrogen atom or a $C_{1-5}$ alkyl group, and p represents an integer of 1 to 5.

[11] The positive photosensitive resin composition according to any one of [6] to [10], wherein the aqueous alkaline solution-soluble resin (c) having an epoxy group and a phenolic hydroxyl group is a reaction product of a compound having at least two epoxy groups in its molecule and a hydroxybenzoic acid, which is a compound having a structure represented by formula (8):

(8)

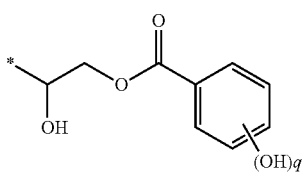

wherein q represents an integer of 1 to 5.

[12] The positive photosensitive resin composition according to [11], wherein the compound having at least two epoxy groups in its molecule is a cresol novolac-type epoxy resin.

[13] The positive photosensitive resin composition according to [11] or [12], wherein the hydroxybenzoic acid is dihydroxybenzoic acid.

[14] The positive photosensitive resin composition according to any one of [6] and [8] to [10], wherein the aqueous alkaline solution-soluble copolymer (d) of a polymerizable monomer having an alkali-soluble functional group and another polymerizable monomer has a structural unit represented by formula (10):

(10)

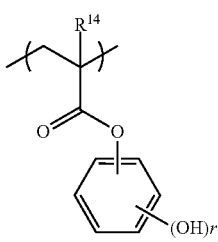

wherein $R^{14}$ represents a hydrogen atom or a $C_{1-5}$ alkyl group, and r represents an integer of 1 to 5, and a structural unit represented by formula (11):

(11)

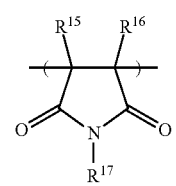

wherein $R^{15}$ and $R^{16}$ each independently represent a hydrogen atom, a $C_{1-3}$ alkyl group, a fully or partially fluorinated $C_{1-3}$ alkyl group, or a halogen atom, $R^{17}$ represents a hydrogen atom, a $C_{1-6}$ linear or cyclic alkyl group, a phenyl group, or a phenyl group substituted by at least one selected from the group consisting of a hydroxyl group, a $C_{1-6}$ alkyl group, and a $C_{1-6}$ alkoxy group.

[15] The positive photosensitive resin composition according to any one of [6] and [8] to [14], wherein the binder resin (A) comprises at least two selected from the group consisting of the polyalkenyl phenol resin (a), the aqueous alkaline solution-soluble resin (c) having an epoxy group and a phenolic hydroxyl group, and the aqueous alkaline solution-soluble copolymer (d) of a polymerizable monomer having an alkali-soluble functional group and another polymerizable monomer.

[16] The positive photosensitive resin composition according to any one of [6] and [8] to [14], wherein the binder resin (A) comprises the aqueous alkaline solution-soluble resin (c) having an epoxy group and a phenolic hydroxyl group and the aqueous alkaline solution-soluble copolymer (d) of a polymerizable monomer having an alkali-soluble functional group and another polymerizable monomer.

[17] A barrier rib of an organic EL element, comprising a cured product of the positive photosensitive resin composition according to any one of [1] to [16].

[18] An insulating film of an organic EL element, comprising a cured product of the positive photosensitive resin composition according to any one of [1] to [16].

[19] An organic EL element, comprising a cured product of the positive photosensitive resin composition according to any one of [1] to [16].

[20] A method of producing a radiation lithography construct, comprising
(1) a coating step of dissolving the positive photosensitive resin composition according to any one of [1] to [16] in a solvent and coating a base material therewith;
(2) a drying step of removing the solvent in the coating of the positive photosensitive resin composition;
(3) an exposure step of performing radiation irradiation through a photomask;
(4) a development step of forming a pattern by alkaline development; and
(5) a heat treatment step of heating at 100° C. to 350° C.

Advantageous Effects of Invention

According to the present invention, a positive photosensitive resin composition having high sensitivity, high-definition, and high pattern formation ability, which can maintain its black color and high-level light shielding function even after treated in a step of high-temperature curing at about 250° C., can be provided.

DESCRIPTION OF EMBODIMENTS

The present invention is described in detail below.

(A) Binder Resin

A binder resin (A) used for the positive photosensitive resin composition of the present invention is not particularly limited. However, it preferably has an alkali-soluble functional group and is alkali-soluble.

An alkali-soluble functional group of the binder resin includes, but is not limited to, a carboxyl group, a phenolic hydroxyl group, a sulfonic acid group, and a phosphoric acid group. A resin having two or more alkali-soluble functional groups may be used.

Examples of a binder resin include an acrylic resin, a styrene resin, an epoxy resin, an amide resin, a phenolic resin, a polyamic acid resin, and these resins to which an alkali-soluble functional group is bound. These resins may be used singly or two or more thereof may be used in combination.

Examples of the binder resin (A) of the positive photosensitive resin composition of the present invention include publicly known phenol resins such as a phenol novolac resin, a cresol novolac resin, a triphenyl methane-type phenol resin, a phenol aralkyl resin, a biphenyl aralkyl phenol resin, and a phenol-dicyclopentadiene copolymer resin. When a publicly known phenol resin is used as a binder resin (A), a number-average molecular weight thereof is preferably from 100 to 50000, more preferably from 500 to 30000, and still more preferably from 800 to 10000, although it varies depending on the resin structure. When the number-average molecular weight is not less than 100, a good pattern resolution is obtained because the alkaline development rate is appropriate and a difference in the dissolution rate between the exposed portion and the unexposed portion is sufficient. When it is not more than 50000, alkaline development performance is good.

The content of the binder resin (A) in the positive photosensitive resin composition of the present invention is preferably from 40 to 85 parts by weight, more preferably from 45 to 83 parts by weight, and still more preferably from 50 to 82 parts by weight based on 100 parts by weight in total of the binder resin (A), the quinonediazide compound (B), and the black dye (C). When the content is not less than 45 parts by weight, appropriate film-remaining ratio, thermostability, sensitivity, and the like can be achieved. When it is not more than 85 parts by weight, hue of a cured film after bake falls within a range in which the L* value is not more than 75 and the a* and b* values are from −15 to 15 in the L*a*b* color system, indicating that a black color is maintained after heating as well.

According to the present invention, the binder resin (A) preferably comprises at least one of following components (a) to (d).

(a) Polyalkenyl Phenol Resin

A polyalkenyl phenol resin is obtained by conducting alkenyl etherification of a hydroxyl group of a publicly known phenol resin and further performing Claisen rearrangement of an alkenyl ether group. In particular, the polyalkenyl phenol resin preferably has a structure represented by formula (1). When the photosensitive resin composition comprises such a resin, it has improved development performance and can contribute to reduction of outgassing.

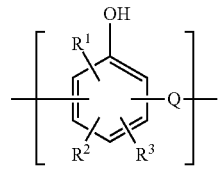

(1)

In formula (1), $R^1$, $R^2$ and $R^3$ each independently represent a hydrogen atom or a $C_{1-5}$ alkyl group, an alkenyl group represented by following formula (2), a $C_{1-2}$ alkoxy group, or a hydroxyl group.

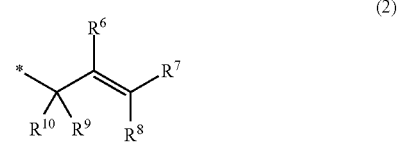

(2)

In formula (2), $R^6$, $R^7$, $R^8$, $R^9$ and $R^{10}$ each independently represent a hydrogen atom, a $C_{1-5}$ alkyl group, a $C_{5-10}$ cycloalkyl group, or a $C_{6-12}$ aryl group. A symbol * in formula (2) represents a bond with a carbon atom that constitutes an aromatic ring.

At least one of $R^1$, $R^2$ and $R^3$ is an alkenyl group represented by formula (2).

Q is an alkylene group represented by —$CR^4R^5$—, a $C_{5-10}$ cycloalkylene group, a divalent organic group having an aromatic ring, a divalent organic group having an alicyclic condensed ring, or a divalent group of any combination thereof, and $R^4$ and $R^5$ each independently represent a hydrogen atom, a $C_{1-5}$ alkyl group, a $C_{2-6}$ alkenyl group, a $C_{5-10}$ cycloalkyl group, or a $C_{6-12}$ aryl group. When two or more structures of formula (1) are present in one molecule, the structures of formula (1) may be the same or different.

In formula (1), $R^1$, $R^2$, and $R^3$ each represent a hydrogen atom, a $C_{1-5}$ alkyl group, an alkenyl group represented by formula (2), a $C_{1-2}$ alkoxy group, or a hydroxyl group, and at least one of $R^1$, $R^2$, and $R^3$ is an alkenyl group represented by formula (2).

For $R^1$, $R^2$, and $R^3$ in formula (1), specific examples of a $C_{1-5}$ alkyl group include a methyl group, an ethyl group, an n-propyl group, an isopropyl group, an n-butyl group, a sec-butyl group, a t-butyl group, and an n-pentyl group. Specific examples of a $C_{1-2}$ alkoxy group include a methoxy group and an ethoxy group.

Regarding an alkenyl group represented by Formula (2), $R^6$, $R^7$, $R^8$, $R^9$, and $R^{10}$ each independently represent a hydrogen atom, a $C_{1-5}$ alkyl group, a $C_{5-10}$ cycloalkyl group, or a $C_{1-2}$ aryl group. Specific examples of a $C_{1-5}$ alkyl group include a methyl group, an ethyl group, an n-propyl group, an isopropyl group, an n-butyl group, a sec-butyl group, a t-butyl group, and an n-pentyl group. Examples of a $C_{5-10}$ cycloalkyl group include a cyclopentyl group, a cyclohexyl group, a methylcyclohexyl group, and a cycloheptyl group. Specific examples of a $C_{6-12}$ aryl group include a phenyl group, a methylphenyl group, an ethylphenyl group, a biphenyl group, and a naphthyl group. Preferably, $R^6$, $R^7$, $R^8$, $R^9$, and $R^{10}$ each independently represent a hydrogen atom or a $C_{1-5}$ alkyl group. Preferable examples of an alkenyl group represented by formula (2) include an allyl group and a methallyl group in view of reactivity, and an allyl group is more preferable. It is most preferable that any one of $R^1$, $R^2$, and $R^3$ is an allyl group or a methallyl group, and the other two thereof each represent a hydrogen atom.

In formula (1), Q is an alkylene group represented by $-CR^4R^5-$, a $C_{5-10}$ cycloalkylene group, a divalent organic group having an aromatic ring, a divalent organic group having an alicyclic condensed ring, or a divalent group that is any combination thereof, wherein $R^4$ and $R^5$ each independently represent a hydrogen atom, a $C_{1-5}$ alkyl group, a $C_{2-6}$ alkenyl group, a $C_{5-10}$ cycloalkyl group, or a $C_{6-12}$ aryl group. Specific examples of a $C_{1-5}$ alkyl group include a methyl group, an ethyl group, an n-propyl group, an isopropyl group, an n-butyl group, a sec-butyl group, a t-butyl group, and an n-pentyl group. Specific examples of a $C_{2-6}$ alkenyl group include a vinyl group, an allyl group, a butenyl group, a pentenyl group, and a hexenyl group. Examples of a $C_{5-10}$ cycloalkyl group include a cyclopentyl group, a cyclohexyl group, a methylcyclohexyl group, and a cycloheptyl group. Specific examples of a $C_{6-12}$ aryl group include a phenyl group, a methylphenyl group, an ethylphenyl group, a biphenyl group, and a naphthyl group. Preferably, $R^4$ and $R^5$ each independently represent a hydrogen atom or a $C_{1-3}$ alkyl group. It is most preferable that both $R^4$ and $R^5$ each represent a hydrogen atom.

Specific examples of a $C_{5-10}$ cycloalkylene group include a cyclopentylene group, a cyclohexylene group, a methylcyclohexylene group, and a cyclohepthylene group. Specific examples of a divalent organic group having an aromatic ring include a phenylene group, a tolylene group, a naphthylene group, a biphenylene group, a fluorenylene group, an anthracenylene group, a xylylene group, a 4,4-methylene diphenyl group, and a group represented by formula (6).

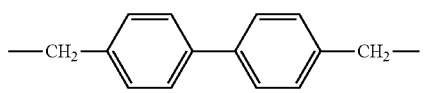

(6)

Specific examples of a divalent organic group having an alicyclic condensed ring include a dicyclopentadienylene group.

When a polyalkenyl phenol resin is used for the binder resin (A) used for the photosensitive resin composition of the present invention, in view of alkaline development performance and outgassing, a particularly preferable example of a polyalkenyl phenol resin is a polyalkenyl phenol resin in which Q in formula (1) is $-CH_2-$, i.e., a polyalkenyl phenol resin having a structure represented by formula (4).

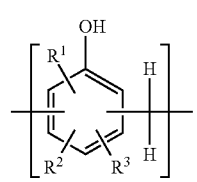

(4)

In formula (4), $R^1$, $R^2$ and $R^3$ are the same as in formula (1).

Preferable $R^1$, $R^2$ and $R^3$ are the same as preferable $R^1$, $R^2$ and $R^3$ in formula (1).

The mole percent of a structural unit represented by formula (1) or formula (4) in a polyalkenyl phenol resin is preferably from 50 to 100 mol %, more preferably from 70 to 100 mol %, and further preferably 80 to 100 mol %. When the mole percent of a structural unit represented by formula (1) or formula (4) in a polyalkenyl phenol resin is not less than 50 mol %, thermostability is improved. Since a phenolic hydroxyl group in a polyalkenyl phenol resin is ionized in the presence of a basic compound so that the polyalkenyl phenol resin can be dissolved in water, it is necessary for a phenolic hydroxyl group to be present in a certain amount or more in consideration of alkaline development performance. Therefore, it is particularly preferable that a polyalkenyl phenol resin having a structure of formula (4) is a polyalkenyl phenol resin having a structural unit represented by formula (4) and a structural unit represented by formula (7).

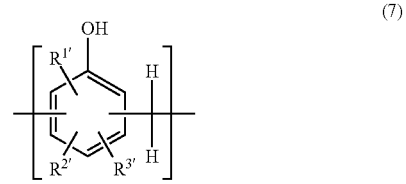

(7)

In formula (7), $R^{1'}$, $R^{2'}$ and $R^{3'}$ each independently represent a hydrogen atom or a $C_{1-5}$ alkyl group.

Regarding a polyalkenyl phenol resin having a structural unit represented by formula (4) and a structural unit represented by formula (7), assuming that the number of a structural unit represented by formula (4) is x and the number of a structural unit represented by formula (7) is y, $0.5 \leq x/(x+y) < 1$, $0 < y/(x+y) \leq 0.5$, x+y is preferably from 2 to 3000, more preferably from 2 to 2000, and still more preferably from 2 to 1000.

In addition, when a polyalkenyl phenol resin is used as a binder resin (A), the number-average molecular weight thereof is preferably from 500 to 5000, more preferably from 800 to 3000, and still more preferably 900 to 2000. When the number-average molecular weight is not less than 500, an appropriate alkaline development rate and a sufficient difference in the dissolution rate between an exposed portion and an unexposed portion are achieved, which means that pattern resolution is good. When it is not more than 5000, good alkaline development performance is achieved.

(b) Hydroxy Polystyrene Resin Derivative

It is also possible to use, as a binder resin (A) of the positive photosensitive resin composition of the present invention, a hydroxy polystyrene resin derivative having a structure represented by formula (3). The photosensitive resin composition comprising such a resin has improved development performance and contributes to reduction of outgassing.

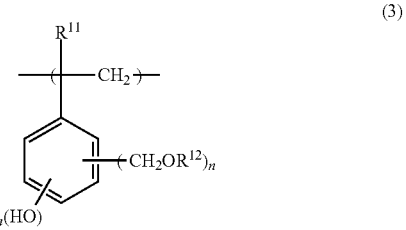

(3)

In formula (3), $R^{11}$ represents a hydrogen atom or a $C_{1-5}$ alkyl group, m represents an integer of 1 to 4, n represents an integer of 1 to 4, m+n is from 2 to 5, $R^{12}$ represents at least one selected from the group consisting of a hydrogen atom, a methyl group, an ethyl group, and a propyl group.

When a hydroxy polystyrene resin derivative is used as a binder resin (A) of the positive photosensitive resin composition of the present invention, it is preferably a copolymer having a structural unit represented by formula (3) and a structural unit represented by formula (5) in view of alkaline development performance and outgassing.

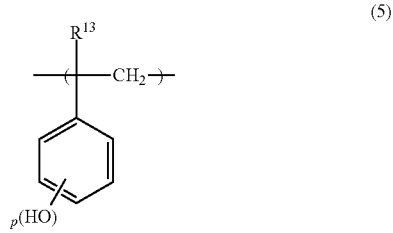

(5)

In formula (5), $R^{13}$ represents a hydrogen atom or a $C_{1-5}$ alkyl group, p represents an integer of 1 to 5.

A hydroxy polystyrene resin derivative having a structural unit represented by formula (3) and a hydroxy polystyrene resin derivative having a structural unit represented by formula (3) and a structural unit represented by formula (5) can be obtained by, for example, polymerizing one or more aromatic vinyl compounds having a phenolic hydroxyl group such as p-hydroxystyrene, m-hydroxystyrene, o-hydroxystyrene, p-isopropenylphenol, m-isopropenylphenol, and o-isopropenylphenol by a publicly known method to obtain a polymer or copolymer, and then partially reacting the polymer or copolymer with formaldehyde and further with alcohol by a publicly known method.

p-Hydroxy styrene and/or m-hydroxy styrene is preferably used for an aromatic vinyl compound having a phenolic hydroxyl group.

When the hydroxy polystyrene resin derivative is used as a binder resin (A) of the positive photosensitive resin composition of the present invention, the number-average molecular weight thereof is preferably from 1000 to 20000, more preferably from 3000 to 10000, and still more preferably from 4000 to 9000. When the molecular weight is not less than 1000, the hydroxy polystyrene resin derivative is appropriate as a resin used as a photosensitive material because it has appropriate alkali solubility. When the molecular weight is not more than 20000, the hydroxy polystyrene resin derivative has good coating performance and development performance.

(c) Aqueous Alkaline Solution-Soluble Resin Having an Epoxy Group and a Phenolic Hydroxyl Group It is also possible to use an aqueous alkaline solution-soluble resin having an epoxy group and a phenolic hydroxyl group as a binder resin (A) of the positive photosensitive resin composition of the present invention.

The aqueous alkaline solution-soluble resin can be obtained by, for example, allowing an epoxy group of a compound having at least two epoxy groups in its molecule (hereinafter sometimes referred to as "epoxy compound") to react with a carboxyl group of a hydroxybenzoic acid.

In the positive photosensitive resin composition of the present invention, an alkali-soluble resin having an epoxy group is advantageous in that when heated, the epoxy group is reacted with a phenolic hydroxyl group and thereby the alkali-soluble resin is crosslinked, and thus, chemical resistance, thermostability, and the like thereof are improved. In addition, when the alkali-soluble resin has a phenolic hydroxyl group, it has the advantage of becoming soluble in an aqueous alkaline solution.

An example in which one of epoxy groups of the epoxy compound reacts with a carboxyl group of a hydroxybenzoic acid, thereby forming a compound having a phenolic hydroxyl group is described in following reaction formula 1.

Reaction formula 1

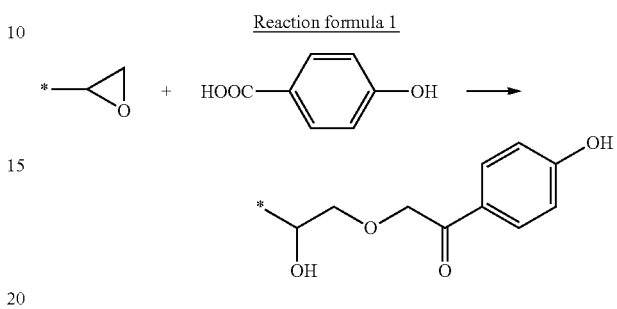

Examples of a compound having at least two epoxy groups in its molecule include a phenol novolac-type epoxy resin, a cresol novolac-type epoxy resin, a bisphenol-type epoxy resin, a biphenol-type epoxy resin, an epoxy resin having a naphthalene skeleton, and a heterocyclic epoxy resin. Each of these epoxy compounds may have two or more epoxy groups in its molecule. The epoxy compounds may be used singly, or two or more thereof may be used in combination. Note that since these compounds are of thermosetting type, it is common knowledge to those skilled in the art that epoxy compounds cannot be unambiguously defined based on the presence or absence of epoxy groups, types of functional group, differences in degree of polymerization, etc. An example of the structure of a novolac-type epoxy resin is represented by formula (9).

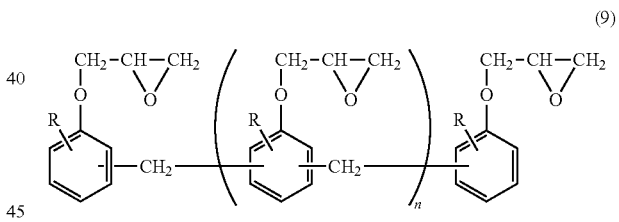

(9)

Examples of a phenol novolac-type epoxy resin include EPICLON® N-770, which is commercially available from DIC Corporation, and jER®-152, which is commercially available from Mitsubishi Chemical Corporation.

Examples of a cresol novolac-type epoxy resin include EPICLON® N-695, which is commercially available from DIC Corporation, and EOCN®-102S, which is commercially available from Nippon Kayaku Co., Ltd.

Examples of a bisphenol-type epoxy resin include bisphenol A-type epoxy resins such as jER® 828 and jER®1001, which are commercially available from Mitsubishi Chemical Corporation, and YD-128™, which is commercially available from Nippon Steel & Sumikin Chemical Co., Ltd.; and bisphenol F-type epoxy resins such as jER® 806, which is commercially available from Mitsubishi Chemical Corporation, and YDF-170™, which is commercially available from Nippon Steel & Sumikin Chemical Co., Ltd.

Examples of a biphenol-type epoxy resin include jER® YX-4000 and jER® YL-6121H, which are commercially available from Mitsubishi Chemical Corporation.

Examples of an epoxy resin having a naphthalene skeleton include NC-7000™, which is commercially available from Nippon Kayaku Co., Ltd., and EXA-4750™, which is commercially available from DIC Corporation.

Examples of an alicyclic epoxy resin include EHPE®-3150, which is commercially available from Daicel Corporation.

Examples of a heterocyclic epoxy resin include TEPIC®, TEPIC-L, TEPIC-H, and TEPIC-S, which are commercially available from Nissan Chemical Industries, Ltd.

The term "hydroxybenzoic acid" refers to a compound in which at least one of groups at the second to sixth positions of benzoic acid is substituted by a hydroxyl group. Examples thereof include salicylic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-hydroxy-5-nitrobenzoic acid, 3-hydroxy-4-nitrobenzoic acid, and 4-hydroxy-3-nitrobenzoic acid. Dihydroxybenzoic acids are preferable for improving alkaline development performance. These hydroxybenzoic acids may be used singly or two or more types thereof may be used in combination.

In a method of obtaining an aqueous alkaline solution-soluble compound having a phenol group from the epoxy compound and hydroxybenzoic acids described above, the amount of hydroxybenzoic acids used is 0.2 to 1.0 equivalents, preferably 0.3 to 0.9 equivalents, and more preferably 0.4 to 0.8 equivalents based on 1 equivalent of an epoxy group of an epoxy compound. When the amount of hydroxybenzoic acids is not less than 0.2 equivalents, sufficient alkali solubility is exhibited. When it is not more than 1.0 equivalent, an increase in the molecular weight due to side reactions can be suppressed.

In order to promote reactions, catalysts may be used. The amount of a catalyst used is 0.1% to 10% by weight based on the amount of a reaction starting material mixture including an epoxy compound and a hydroxybenzoic acid. The reaction temperature is 60° C. to 150° C., and the reaction time is 3 to 30 hours. Examples of a catalyst used in this reaction include triethylamine, benzyldimethylamine, triethyl ammonium chloride, benzyltrimethylammonium bromide, benzyltrimethylammonium iodide, triphenylphosphine, chromium octanoate, and zirconium octanoate.

The number-average molecular weight of the aqueous alkaline solution-soluble resin having an epoxy group and a phenolic hydroxyl group is preferably from 500 to 8000, more preferably from 1000 to 6000, and still more preferably from 1500 to 5000. When the molecular weight is not less than 500, the aqueous alkaline solution-soluble resin is good as a photosensitive material resin because it has appropriate alkali solubility. When the molecular weight is not more than 8000, the aqueous alkaline solution-soluble resin has good coating performance and development performance.

(d) Aqueous Alkaline Solution-Soluble Copolymer of a Polymerizable Monomer Having an Alkali-Soluble Functional Group and Another Polymerizable Monomer As a binder resin (A), an aqueous alkaline solution-soluble copolymer of a polymerizable monomer having an alkali-soluble functional group and another polymerizable monomer can be used. Examples of an alkali-soluble functional group include a carboxyl group, an alcoholic hydroxyl group, and a phenolic hydroxyl group. Examples of a polymerizable functional group of a polymerizable monomer include radical polymerizable functional groups such as $CH_2=CH-$, $CH_2=C(CH_3)-$, $CH_2=CHCO-$, $CH_2=C(CH_3)CO-$, and $-OC-CH=CH-CO-$.

An aqueous alkaline solution-soluble copolymer of a polymerizable monomer having an alkali-soluble functional group and another polymerizable monomer can be produced by, for example, conducting radical polymerization of a polymerizable monomer having an alkali-soluble functional group and another polymerizable monomer. In addition, after a copolymer is synthesized via radical copolymerization, a derivative, to which a functional group has been added, may be used. Examples of a polymerizable monomer having an alkali-soluble functional group include 4-hydroxystyrene, (meth)acrylic acid, α-bromo(meth)acrylic acid, α-chloro(meth)acrylic acid, β-furyl(meth)acrylic acid, β-styryl(meth)acrylic acid, maleic acid, monomethyl maleate, monoethyl maleate, monoisopropyl maleate, fumaric acid, cinnamic acid, α-cyanocinnamic acid, itaconic acid, crotonic acid, propiolic acid, 4-hydroxyphenyl methacrylate, 3,5-dimethyl-4-hydroxybenzylacrylamide, 4-hydroxyphenylacrylamide, 4-hydroxyphenylmaleimide, 3-maleimidopropionic acid, 4-maleimidobutyric acid, and 6-maleimidohexanoic acid. Example of another polymerizable monomer include polymerizable styrene derivatives such as styrene, vinyl toluene, α-methylstyrene, p-methylstyrene, and p-ethylstyrene; acrylamide, acrylonitrile; vinyl alcohol ethers such as vinyl n-butyl ether; (meth)acrylate esters such as alkyl (meth)acrylate, tetrahydrofurfuryl (meth)acrylate, dimethylaminoethyl (meth)acrylate, diethylaminoethyl (meth)acrylate, and glycidyl (meth)acrylate, 2,2, 2-trifluoroethyl (meth)acrylate, and 2,2,3,3-tetrafluoropropyl (meth)acrylate; maleic anhydride, monoester of maleic acid, and N-substituted maleimides such as phenylmaleimide, and cyclohexylmaleimide.

When an aqueous alkaline solution-soluble copolymer (d) of a polymerizable monomer having an alkali-soluble functional group and another polymerizable monomer also corresponds to a hydroxy polystyrene resin derivative (b), a hydroxy polystyrene resin derivative (b) is handled as an aqueous alkaline solution-soluble copolymer (d) of a polymerizable monomer having an alkali-soluble functional group and another polymerizable monomer. When an aqueous alkaline solution-soluble copolymer (d) of a polymerizable monomer having an alkali-soluble functional group and another polymerizable monomer also corresponds to an aqueous alkaline solution-soluble resin (c) having an epoxy group and a phenolic hydroxyl group, an aqueous alkaline solution-soluble resin (c) having an epoxy group and a phenolic hydroxyl group is handled as an aqueous alkaline solution-soluble copolymer (d) of a polymerizable monomer having an alkali-soluble functional group and another polymerizable monomer. In other words, a hydroxy polystyrene resin derivative (b) and an alkaline aqueous solution-soluble resin (c) having an epoxy group and a phenolic hydroxyl group exclude those corresponding to an aqueous alkaline solution-soluble copolymer (d) of a polymerizable monomer having an alkali-soluble functional group and a different polymerizable monomer.

It is particularly preferable to use 4-hydroxyphenyl methacrylate as the polymerizable monomer having an alkali-soluble functional group and phenylmaleimide and/or cyclohexylmaleimide as the another polymerizable monomer. The use of a resin obtained via radical polymerization of these polymerizable monomers allows the improvement of shape maintenance capacity and development performance and also contributes to reduction of outgassing.

When a radical copolymer of 4-hydroxyphenyl methacrylate, phenylmaleimide, and cyclohexylmaleimide or a radical copolymer of 4-hydroxyphenyl methacrylate and cyclohexylmaleimide is used as a binder resin (A) of the positive photosensitive resin composition of the present invention, the number-average molecular weight thereof is preferably from 1000 to 30000, more preferably from 2000 to 25000, and still more preferably from 3000 to 20000. When the molecular weight is not less than 1000, the binder resin (A) has appropriate alkali solubility, and thus, it is suitable as a resin for a photosensitive material. When the molecular weight is not more than 30000, it has good development performance.

One binder resin (A) may be used singly, or two or more binder resins may be used in combination. In particular, the binder resin (A) preferably comprises at least one selected from the resin components (a) to (d). When the binder resin (A) comprises two or more of the resin components (a) to (d), any combination thereof can be used. The binder resin (A) more preferably comprises at least two selected from the resin components (a), (c), and (d), and still more preferably comprises the resin components (c) and (d). In addition, it preferably comprises at least one selected from (a), (b), and (c) in another embodiment.

The amount of at least one component selected from (a) to (d) based on 100 parts by weight of the binder resin (A) is preferably not less than 0.5 parts by weight, more preferably not less than 50 parts by weight, and still more preferably not less than 88 parts by weight. When the amount of at least one component selected from (a) to (d) based on 100 parts by weight of the binder resin (A) is from 0.5 to 99.5 parts by weight, a resin composition has good thermostability.

The four components (a) to (d) may be used in combination. In such case, it is preferable that the proportion of a polyalkenyl phenol resin (a) in the binder resin is from 5' to 60% by weight, the proportion of a hydroxy polystyrene resin derivative (b) in the binder resin is from 5' to 30% by weight, the proportion of an alkaline aqueous solution-soluble resin (c) having an epoxy group and a phenolic hydroxyl group in the binder resin is 35% to 90% by weight, and the proportion of an aqueous alkaline solution-soluble copolymer (d) of a polymerizable monomer having an alkali-soluble functional group and another polymerizable monomer in the binder resin is from 10% to 90% by weight.

(B) Quinonediazide Compound

The positive photosensitive resin composition of the present invention comprises a quinonediazide compound as a radiation sensitive compound. Examples of a quinonediazide compound include a product obtained by combining a quinonediazidesulfonic acid to a polyhydroxy compound via an ester bond, a product obtained by combining a quinonediazidesulfonic acid to a polyamino compound via a sulfonamide bond, and a product obtained by combining a quinonediazidesulfonic acid to a polyhydroxy polyamino compound via an ester-bound and/or sulfonamide-bound. In consideration of contrast between an exposed portion and an unexposed portion, it is preferable that not less than 20 mol % of all functional groups of such a polyhydroxy compound or polyamino compound are substituted by quinonediazide. By using such quinonediazide compound, it is possible to obtain a positive photosensitive resin composition that is sensitive to usual ultraviolet rays such as i ray (365 nm), h ray (405 nm), and g ray (436 nm) of mercury lamps.

Examples of a polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP, which are commercially available from Honshu Chemical Industry Co., Ltd., BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A, which are commercially available from Asahi Yukizai Corporation, 2,6-dimethoxy methyl-4-t-butyl phenol, 2,6-dimethoxy methyl-p-cresol, 2,6-diacetoxymethyl-p-cresol, naphthol, tetrahydroxy benzophenone, gallic acid methyl ester, bisphenol A, bisphenol E, methylene bisphenol, and BisP-AP, which are commercially available from Honshu Chemical Industry Co., Ltd.

Specific examples of a quinonediazide compound include 1,2-naphthoquinonediazide-4-sulfonate or 1,2-naphthoquinonediazide-5-sulfonate of the above-described polyhydroxy compound.

A quinonediazide compound undergoes the reaction represented by the following reaction formula 2 when being exposed to ultraviolet light or the like, thereby generating carboxyl groups. As a result of generation of carboxyl groups, an exposed portion (coat) becomes soluble in an alkaline solution, resulting in the exhibition of alkaline development performance.

Reaction formula 2

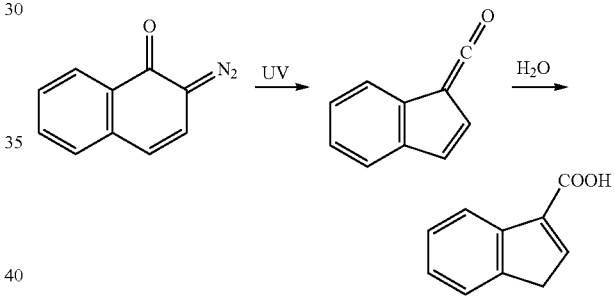

The content of a quinonediazide compound in the photosensitive resin composition of the present invention varies depending on a quinonediazide compound to be used. It is preferably from 5 to 45 parts by weight, more preferably from 10 to 40 parts by weight, and still more preferably from 11 to 30 parts by weight based on 100 parts by weight in total of a binder resin (A), a quinonediazide compound (B), and a black dye (C). When the content is not less than 5 parts by weight, it results in good alkaline development performance. When the content is not more than 45 parts by weight, weight loss upon heating is unlikely to increase at not less than 300° C.

(C) Black Dye

Black dyes used for the positive photosensitive resin composition of the present invention are dyes specified by Colour Index of Solvent Black 27 to 47. A black dye is preferably specified by Colour Index of Solvent Black 27, 29, or 34. When at least one of black dyes specified by Colour Index of Solvent Black 27 to 47 is used, the hue of the positive photosensitive resin composition after baking corresponds to an L* value of 75 or less, an a* value of −15 to 15, and a b* value of −15 to 15 in the L*a*b color system, indicating that a darker black-like color can be maintained. This is advantageous because when the positive photosensitive resin composition of the present invention is used as a barrier rib material for a display unit of an organic EL display or the like, visibility of the display unit can be improved.

The content of a black dye in the positive photosensitive resin composition of the present invention is preferably from 0.1 to 50 parts by weight, more preferably from 1 to 45 parts by weight, and still more preferably from 3 to 40 parts by weight based on 100 parts by weight in total of a binder resin such as a polyalkenyl phenol resin (A), a quinonediazide compound (B), and a black dye (C). When the content is not less than 0.1 parts by weight, the hue of a cured film after baking corresponds to an L* value of not more than 75 and a* and b* values of from −15 to 15, indicating that the black color is maintained after heating as well. In addition, when the content is not more than 50 parts by weight, it results in appropriate film-remaining ratio, thermostability, sensitivity, and the like.

(D) Solvent

The positive photosensitive resin composition of the present invention is dissolved in a solvent and used in the liquid form. For example, a binder resin is dissolved in a solvent, the obtained solution is mixed with a quinonediazide compound, a black dye, and if necessary, additives such as a thermosetting agent and a surfactant, thereby making it possible to prepare a positive photosensitive resin composition in the liquid form. The viscosity of the positive photosensitive resin composition of the present invention can be adjusted appropriate to various coating methods depending on content of the solvent.

Examples of a solvent include glycol ethers such as ethylene glycol monomethyl ether, ethylene glycol dimethyl ether, ethylene glycol methyl ethyl ether, and ethylene glycol monoethyl ether; ethylene glycol alkyl ether acetates such as methyl cellosolve acetate, and ethyl cellosolve acetate; diethylene glycols such as diethylene glycol monomethyl ether, diethylene glycol diethyl ether, diethylene glycol dimethyl ether, diethylene glycol ethyl methyl ether, diethylene glycol monoethyl ether, and diethylene glycol monobutyl ether; propylene glycol alkyl ether acetates such as propylene glycol methyl ether acetate and propylene glycol ethyl ether acetate; aromatic hydrocarbons such as toluene and xylene; ketones such as methyl ethyl ketone, methyl amyl ketone, cyclohexanone, 4-hydroxy-4-methyl-2-pentanone, and cyclohexanone; esters such as ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutyrate, methyl 3-methoxypropionate, ethyl 3-methoxypropionate, methyl 3-ethoxypropionate, ethyl 3-ethoxypropionate, ethyl acetate, butyl acetate, methyl lactate, ethyl lactate, and γ-butyrolactone; and amides such as N-methyl-2-pyrrolidone, N,N-dimethylformamide, and N,N-dimethylacetamide. These solvents may be used singly or two or more thereof may be used in combination.

(E) Optional Component

It is possible to add a thermosetting agent, a surfactant, a coloring agent other than (C), and the like as optional components to the positive photosensitive resin composition of the present invention. Note that it is defined that an optional component (E) does not correspond to any of (A) to (D).

A thermal radical generator can be used as a thermosetting agent. An example of a preferable thermal radical generator includes an organic peroxide. Specific examples of an organic peroxide include dicumyl peroxide, 2,5-dimethyl-2,5-di(tert-butylperoxy)hexane, tert-butyl cumyl peroxide, di-tert-butyl peroxide, 1,1,3,3-tetramethylbutyl hydroperoxide, and cumene hydroperoxide, which are organic peroxides having a 10-hour half-life temperature of 100° C. to 170° C.

The content of a thermosetting agent is preferably not more than 5 parts by weight, more preferably not more than 4 parts by weight, and still more preferably not more than 3 parts by weight based on 100 parts by weight in total of a binder resin, a quinonediazide compound, a black dye, and other solid contents (except for a thermosetting agent).

The positive photosensitive resin composition of the present invention may further comprise a surfactant as an optional component in order to improve, for example, coating performance or development performance of a coating film.

Examples of such a surfactant include non-ionic surfactants such as polyoxyethylene alkyl ethers such as polyoxyethylene lauryl ether, polyoxyethylene stearyl ether, and polyoxyethylene oleyl ether; polyoxyethylene aryl ethers such as polyoxyethylene octylphenyl ether and polyoxyethylene nonylphenyl ether; polyoxyethylene dialkyl esters such as polyoxyethylene dilaurate and polyoxyethylene distearate; fluorinated surfactants such as MEGAFACE® F-251, F-281, F-430, F-444, R-40, F-553, F-554, F-555, F-556, F-557, and F-558, which are commercially available from DIC Corporation, Surflon® S-242, S-243, S-386, S-420, and S-611, which are commercially available from AGC Seimi Chemical Co., Ltd.; and organosiloxane polymers KP323, KP326, and KP341, which are commercially available from Shin-Etsu Chemical Co., Ltd. These may be used singly or two or more thereof may be used.

Such a surfactant is added in an amount of preferably not more than 2 parts by weight, more preferably not more than 1 part by weight, and still more preferably not more than 0.5 parts by weight based on 100 parts by weight in total of a binder resin, a quinonediazide compound, a black dye, and other solid contents (except for a surfactant).

The positive photosensitive resin composition of the present invention may further comprise a coloring agent other than black dyes specified by Colour Index of Solvent Blacks 27 to 47 as an optional component. Examples of such coloring agent include dyes, organic colorants, and inorganic colorants, which can be used depending on purposes. Note that the contents of coloring agents other than black dyes fall within a range that does not impair the effects of the present invention.

Specific examples of dyes include azo dyes, benzoquinone dyes, naphthoquinone dyes, anthraquinone dyes, cyanine dyes, squarylium dyes, chloconium dyes, merocyanine dyes, stilbene dyes, diphenylmethane dyes, triphenylmethane dyes, fluoran dyes, spiropyran dyes, phthalocyanine dyes, indigo dyes, fulgide dyes, nickel complex dyes, and azulene dyes.

Examples of colorants include black colorants such as carbon black, carbon nanotube, acetylene black, black lead, iron black, aniline black, and titanium black, C.I. Pigment Yellow 20, 24, 86, 93, 109, 110, 117, 125, 137, 138, 147, 148, 153, 154, and 166, C.I. Pigment Orange 36, 43, 51, 55, 59, and 61, C.I. Pigment Red 9, 97, 122, 123, 149, 168, 177, 180, 192, 215, 216, 217, 220, 223, 224, 226, 227, 228, and 240, C.I. Pigment Violet 19, 23, 29, 30, 37, 40, and 50, C.I. Pigment Blue 15, 15:1, 15:4, 22, 60, and 64, C.I. Pigment Green 7, and C.I. Pigment Brown 23, 25, and 26.

(Preparation Method)

The positive photosensitive resin composition of the present invention is prepared by dissolving or dispersing the above-described binder resin (A), quinonediazide compound (B), black dye (C), and if necessary, an optional component (E) in a solvent, followed by mixing. The solid content concentration may be determined depending on the intended use, if appropriate. However, the solid content concentration is from 1% to 60% by weight, preferably from 3% to 50% by weight, and more preferably from 5% to 40% by weight.

A publicly known method can be used as a method of dispersion and mixing when a colorant is used in combination. For example, a ball-type mill such as a ball mill, a sand mill, a bead mill, a paint shaker, or a rocking mill, a blade-type mixer such as a kneader, a paddle mixer, a planetary mixer, or a Henschel mixer, a roll-type mixer such as a triple roll mixer, or other mixers such as a Raikai mixer (stone mill), a colloid mill, an ultrasonic mixer, a homogenizer, or a rotation/revolution mixer may be used. In view of dispersion efficiency and fine dispersion, a bead mill is preferable.

The composition solution prepared as described above is usually filtered before used. Examples of means of filtration include a Millipore filter having a pore size of 0.05 to 1.0 µm.

The thus prepared positive photosensitive resin composition of the present invention is also excellent in terms of long-term storage stability.

(Pattern Formation/Curing Method)

When the positive photosensitive resin composition of the present invention is used for radiation lithography, the positive photosensitive resin composition of the present invention dissolved in a solvent is applied to a substrate surface and then the solvent is removed by drying by means of heating, thereby forming a coating film. A method of coating a substrate surface with a positive photosensitive resin composition is not particularly limited. Various methods such as a spray method, a roll coating method, a slit method, and a rotary coating method can be employed as the coating.

After the positive photosensitive resin composition of the present invention dissolved in a solvent is applied to a substrate surface, the solvent is usually dried by heating (prebake), thereby forming a coating film. Heating conditions differ depending on types of components, mixing ratios, etc. However, a coating film can be obtained by conducting heat treatment at usually 70° C. to 130° C. for a certain period of time, for example, 1 to 20 minutes on a hot plate and 3 to 60 minutes in an and oven.

Next, after the prebaked coating film is irradiated with a radioactive ray (e.g., visible light, ultraviolet ray, far-ultraviolet ray, X ray, electron ray, gamma ray, or synchrotron radioactive ray) through a mask having a given pattern (exposure step), the pattern is developed using a developer such that an unnecessary portion is removed, thereby forming a coating film having a given pattern (development step). When naphthoquinonediazide sulfonate is preferably used as a positive photosensitive compound, a preferable radioactive ray is an ultraviolet ray or visible light having a wavelength of from 250 to 450 nm. Examples of a developer that can be used include aqueous solutions of alkalis, e.g., inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-propylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, cyclic amines such as pyrrol, piperidine, 1,8-diazabicyclo[5.4.0]-7-undecene, and 1,5-diazabicyclo[4.3.0]-5-nonane. In addition, it is also possible to use, as a developer, an aqueous solution obtained by adding appropriate amounts of a water-soluble organic solvent such as methanol or ethanol, a surfactant, and the like to the above-described alkaline aqueous solution. The development time is usually from 30 to 180 seconds, and a development method may be any of a paddle method, a shower method, a dipping method, and the like. After development, running water washing is carried out for 30 to 90 seconds so as to remove an unnecessary portion and air drying is performed using compressed air or nitrogen, thereby forming a pattern. Thereafter, the obtained pattern is heat-treated by a heating apparatus such as a hot plate or an oven at a certain temperature of 120° C. to 350° C., for example, for 20 to 200 minutes. Thus, a coating film can be obtained. The temperature may be increased in a stepwise manner (heat treatment step).

The present invention also encompasses a method of producing a radiation lithography construct, comprising (1) a coating step of dissolving the positive photosensitive resin composition in a solvent and coating a base material therewith; (2) a drying step of removing the solvent in the coating of the positive photosensitive resin composition; (3) an exposure step of performing radiation irradiation through a photomask; (4) a development step of forming a pattern by alkaline development; and (5) a heat treatment step of heating at 100° C. to 350° C. This method can be used for formation of a barrier rib and an insulating film of an organic EL element.

The present invention also encompasses a barrier rib of an organic EL element comprising a cured product of the positive photosensitive resin composition.

The present invention also encompasses an insulating film of an organic EL element comprising a cured product of the positive photosensitive resin composition.

The present invention also encompasses an organic EL element comprising a cured product of the positive photosensitive resin composition.

EXAMPLES

The present invention is specifically described with reference to the Examples and Comparative Examples below. However, the present invention is not limited to the Examples.

(1) Resin Synthesis

[Production Example 1] Production of a Polyallyl Phenol Resin

A solution prepared by dissolving 201 g (1.45 mol) of potassium carbonate which was commercially available from Nippon Soda Co., Ltd. in 100 g of pure water, 100.0 g of a phenol novolac resin "Shownol® BRN-5834Y" which was commercially available from Aica SDK Phenol Co., Ltd., and 16 g of isopropyl alcohol which was commercially available from Wako Pure Chemical Industries, Ltd. were placed in a 1000-mL three-necked flask, and a reactor was nitrogen-substituted, followed by heating to 85° C. Allyl acetate which was commercially available from Showa Denko K.K. in an amount of 84 g (0.84 mol), 0.40 g (palladium: 0.188 mmol) of 50% water-containing 5%-Pd/C-STD type (a stabilized allylation reaction catalyst prepared by dispersing 5% by weight of metallic palladium in activated carbon and adding water to the metallic palladium-dispersed activated carbonso that the content thereof may be 50% by weight, which was commercially available from N.E. Chemcat Corporation), and 2.45 g (9.4 mmol) of triphenylphosphine (an activator for the above palladium-containing allylation reaction catalyst, which was commercially available from Hokko Chemical Industry Co., Ltd.) were added under a nitrogen stream, and the temperature was increased to 105° C. in a nitrogen atmosphere, thereby conducting a reaction for 4 hours. Then, 14 g (0.14 mol) of allyl acetate was further added. Heating was continued for 10 hours while confirming generation of allyl ether groups by 1H-NMR. Thereafter, stirring was terminated and the mixture was allowed to stand still such that the mixture was separated into two layers, i.e., an organic layer and an aqueous layer. Pure water (200 g) was added until the precipitated salt was dissolved. Then, 200 g of toluene was added. The temperature was maintained at not less than 80° C. and it was confirmed that formation of a white precipitate did not take place. Thereafter, Pd/C was collected by filtration using a 1-μm membrane filter ("KST-142-JA" which was commercially available from Advantech Co., Ltd. at a pressure of 0.3 MPa. The filtrate was washed with 100 g of toluene and the aqueous layer was separated. The organic layer was washed with 200 g of water twice, thereby confirming that the aqueous layer was neutral. The organic layer was separated and concentrated under reduced pressure. Thus, a phenol novolac-type poly(allyl ether) resin in the form of brown oily matter was obtained.

Subsequently, 125 g of the phenol novolac-type poly(allyl ether) resin was placed in a 500-mL flask equipped with a mechanical stirrer and diluted with 130 g of γ-butyrolactone which was commercially available from Wako Pure Chemical Industries, Ltd. The dilution was heated to 170° C. while stirring at 300 rpm. A Claisen rearrangement reaction was conducted for 30 hours while confirming a decrease of allyl ether groups by $^1$H-NMR. After the reaction, the solution was adjusted to room temperature and diluted with γ-butyrolactone to a solid content of 20% by weight, thereby obtaining a phenol novolac-type polyallyl phenol resin solution (hereinafter referred to as "resin solution a1"). The solid content of this polyallyl phenol resin had a hydroxyl group equivalent of 132, a number-average molecular weight of 1100, and a weight-average molecular weight of 9900.

This resin was found to be a polyalkenyl phenol resin having a structural unit represented by formula (4) and a structural unit represented by formula (7). In formula (4), one of $R^1$, $R^2$, and $R^3$ represents an allyl group and the others each represent a hydrogen atom. In formula (7), $R^{1'}$, $R^{2'}$, and $R^{3'}$ each represent a hydrogen atom. Assuming that the number of a structural unit represented by formula (4) is x and the number of a structural unit represented by formula (7) is y, x/(x+y) is 0.85 and y/(x+y) is 0.15.

[Production Example 2] Production of a Hydroxy Polystyrene Resin Derivative

Sodium hydroxide in an amount of 10.8 g (0.27 mol) was dissolved in 100 g of pure water in a 500-mL eggplant-shaped flask. Next, 17.8 g of MARUKA LYNCUR® H-2P, which was polyvinyl phenol and commercially available from Maruzen Oil Co., Ltd., was added and completely dissolved. Subsequently, 92 g of an aqueous formaldehyde solution having a concentration of 36% to 38% by weight, which was commercially available from Wako Pure Chemical Industries, Ltd., was added dropwise at 20° C. to 25° C. over 2 hours. Thereafter, the solution was stirred at 20° C. to 25° C. for 24 hours. Sulfuric acid, which was commercially available from Wako Pure Chemical Industries, Ltd., in an amount of 13.3 g and 100 g of pure water were added dropwise thereto for neutralization, thereby allowing a solid to be deposited. The solid was washed, filtered, and vacuum-dried at 35° C. for 12 hours. Thus, 27 g of a milky white powder was collected. The powder was dissolved in γ-butyrolactone, which was commercially available from Wako Pure Chemical Industries, Ltd., to obtain a resin solution having a solid content of 20% by weight (hereinafter referred to as "resin solution b1"). The number-average molecular weight was 5600 and the weight-average molecular weight was 36000.

This resin has a structure represented by formula (4) where $R^{11}$ and $R^{12}$ each represent hydrogen, m is 1, and n is 1.

[Production Example 3] Production of an Aqueous Alkaline Solution-Soluble Resin Having an Epoxy Group and a Phenolic Hydroxyl Group γ-Butyrolactone which was commercially available from Mitsubishi Chemical Corporation in an amount of 60 g, as a solvent, and 42 g of EPICLON® N-695, which was a cresol novolac-type epoxy resin having an epoxy equivalent of 210 and commercially available from DIC Corporation, as a compound having at least two epoxy group in its molecule, were placed in a 300-mL three-necked flask and dissolved in a nitrogen atmosphere at 60° C. 3,5-Dihydroxybenzoic acid which was commercially available from Wako Pure Chemical Industries, Ltd. in an amount of 15.5 g (0.10 mol, 0.5 equivalents based on 1 equivalent of the epoxy), as an hydroxybenzoic acid, and 0.2 g (0.76 mmol) of triphenylphosphine which was commercially available from Hokko Chemical Industry Co., Ltd., as a reaction catalyst, were added thereto, and a reaction was carried out at 110° C. for 12 hours. The reaction solution was cooled to room temperature and diluted with γ-butyrolactone to a solid content of 20% by weight. The solution was filtered to obtain 260 g of a filtrate (hereinafter referred to as "resin solution c1"). The obtained reaction product had a number-average molecular weight of 2400 and a weight-average molecular weight of 5600.

[Production Example 4] Production of an Aqueous Alkaline Solution-Soluble Resin Having an Epoxy Group and a Phenolic Hydroxyl Group A reaction was carried out in the same manner as in Production Example 3 except that 3,5-dihydroxybenzoic acid which was commercially available from Wako Pure Chemical Industries, Ltd. in an amount of 21.7 g (0.14 mol, 0.7 equivalents based on 1 equivalent of the epoxy) was used and a reaction was carried out at 110° C. for 24 hours to obtain resin solution c2. The obtained reaction product had a number-average molecular weight of 3200 and a weight-average molecular weight of 9000.

[Production Example 5] Production of an Aqueous Alkaline Solution-Soluble Copolymer of a Polymerizable Monomer Having an Alkali-Soluble Functional Group and Another Polymerizable Monomer 4-Hydroxyphenyl methacrylate "PQMA" which was commercially available from Showa Denko K.K. in an amount of 12.8 g, 6 g of N-phenylmaleimide which was commercially available from Nippon Shokubai Co., Ltd., 6 g of N-cyclohexylmaleimide which was commercially available from Nippon Shokubai Co., Ltd., and 50 g of dimethylformamide, as a solvent, were placed in a 100-mL three-necked flask and completely dissolved in a nitrogen gas atmosphere. Next, 0.26 g of V-601 which was commercially available from Wako Pure Chemical Industries, Ltd., as a polymerization initiator, and 0.43 g of S-dodecyl-S'-(α,α'-dimethyl-α"-acetic acid)trithiocarbonate which was commercially available from Sigma-Aldrich, as an RAFT agent, were added, and the temperature was increased to 85° C., and a reaction was carried out for 3 hours. The reaction solution was cooled to room temperature and added dropwise to 3000 g of toluene, thereby allowing a polymer to be precipitated. The precipitated polymer was collected by filtration and vacuum-dried at 60° C. for 3 hours vacuum, thereby collecting 19 g of a milky white powder. The powder was dissolved in γ-butyrolactone to obtain a resin solution having a solid content of 20% by weight (hereinafter referred to as "resin solution d1"). The number-average molecular weight was 10000, and the weight-average molecular weight was 24000.

[Production Example 6] Production of an Aqueous Alkaline Solution-Soluble Copolymer of a Polymerizable Monomer Having an Alkali-Soluble Functional Group and Another Polymerizable Monomer 4-Hydroxyphenyl methacrylate "PQMA" which was commercially available from Showa Denko K.K. in an amount of 76.8 g, 28.8 g of N-cyclohexylmaleimide which was commercially available from Nippon Shokubai Co., Ltd., 1.80 g of V-601 which was commercially available from Wako Pure Chemical Industries, Ltd., as a polymerization initiator, and 1.92 g of S-dodecyl-S'-(α,α'-dimethyl-α"-acetic acid)trithiocarbonate which was commercially available from Sigma-Aldrich, as an RAFT agent, were completely dissolved in 180 g of 1-methoxy-2-propyl acetate which was commercially available from Daicel Corporation, and added dropwise over 1 hour to 180 g of 1-methoxy-2-propyl acetate, which was commercially available from Daicel Corporation and was beforehand heated to 85° C., in a nitrogen gas atmosphere in a 500-mL three-necked flask, and then, a reaction was carried out at 85° C. for 3 hours. The reaction solution was cooled to room temperature and added dropwise to 1200 g of toluene, thereby allowing a polymer to be precipitated. The precipitated polymer was collected by filtration and vacuum-dried at 80° C. for 7 hours, thereby collecting 104.4 g of a white powder. The powder was dissolved in γ-butyrolactone to obtain a resin solution having a solid content of 20% by weight (hereinafter referred to as "resin solution d2"). The number-average molecular weight was 12400, and the weight-average molecular weight was 21100.

(2) Starting Materials (A) Binder Resins
Resin solutions a1, b1, c1, c2, d1, and d2: Resin solutions synthesized in Production Examples 1 to 6.
Resin solution x1: Novolac phenol resin BRM-595M which was commercially available from Showa Denko K.K. and was treated by a reprecipitation method to remove low-molecular-weight components, and the solid content of which was adjusted to 20% by weight with γ-butyrolactone.
Resin solution x2: Cresol novolac phenol resin AV light EP4050G, which was commercially available from Asahi Yukizai Corporation, and the solid content of which was adjusted to 20% by weight with γ-butyrolactone.

Resin solution x3: 2,4,6-Tris[bis(methoxymethyl)amino]-1,3,5-triazine, which was commercially available from Tokyo Chemical Industry Co., Ltd., and the solid content of which was adjusted to 20% by weight with γ-butyrolactone.
Resin solution x4: Polyhydroxy styrene resin MARUKA LYNCUR H-2P, which was commercially available from Maruzen Oil Co., Ltd., and the solid content of which was adjusted to 20% by weight with γ-butyrolactone.
Resin solution x5: Cresol novolac-type polyfunctional epoxy resin EPICLON N-695, which was commercially available from DIC Corporation, and the solid content of which was adjusted to 20% by weight with γ-butyrolactone.

(B) Quinonediazide Compounds
TS-130A: 1,2-Naphthoquinonediazide-5-sulfonate of α,α,α-tris(4-hydroxyphenyl)-1-ethyl-4-isopropylbenzene, which was commercially available from Toyo Gosei Co., Ltd.
CNB-150: Ester of bis{3-(4-hydroxybenzyl)-4-hydroxy-2,5-dimethylphenyl}methane and 6-diazo-5,6-dihydro-5-oxonaphthalene-1-sulfonic acid, which was commercially available from Toyo Gosei Co., Ltd.

(C) Black Dyes
VALIFAST® BLACK 3830: Mixture of Solvent Black 27 and an amine, which was commercially available from Orient Chemical Industries Co., Ltd.
VALIFAST® BLACK 3804: Black dye specified by C.I. Solvent Black 34, which was commercially available from Orient Chemical Industries Co., Ltd.
VALIFAST® BLACK 3810: Black dye specified by Colour Index of Solvent Black 29, which was commercially available from Orient Chemical Industries Co., Ltd.

(D) Solvent γ-Butyrolactone (E) Optional Components
Surflon® S-386: Perfluoroalkyl compound, which was commercially available from AGC Seimi Chemical Co., Ltd.
NUBIAN® BLACK TN-870: Solvent Black 7, which was commercially available from Orient Chemical Industries Co., Ltd.
VALIFAST® BLACK 1821: Mixture of Solvent Black 7 and a linear alkylbenzene sulfonic acid, which was commercially available from Orient Chemical Industries Co., Ltd.
Elixa Black 888: Aromatic compound, which was commercially available from Orient Chemical Industries Co., Ltd.
ETAC: Leuco dye not specified by Colour Index, which was commercially available from Yamada Chemical Co., Ltd.
S-205: Leuco dye not specified by Colour Index, which was commercially available from Yamada Chemical Co., Ltd.

(3) Preparation and Evaluation of a Positive Photosensitive Resin Composition

Example 1

Five (5) parts by weight of resin solution a1 obtained in Production Example 1, 5 parts by weight of resin solution b1 obtained in Production Example 2, and 10 parts by weight of resin solution c1 obtained in Production Example 3 were mixed and dissolved, and 1 part by weight of TS-130A, as a quinonediazide compound, 0.17 parts by weight of VALIFAST® BLACK3830, as a black dye, and 0.0075 parts by weight of Surflon® S-386, as a surfactant, were added thereto, and further mixed. After dissolution was visually confirmed, the mixture was filtered through a Millipore filter having a pore size of 0.22 μm to prepare a positive photosensitive resin composition having a solid content of 24% by weight.

Examples 2 to 14 and Comparative Examples 1 to 5

Positive photosensitive resin compositions were prepared by the same method as in Example 1 except that the compositions listed in Tables 1 and 2 were used.

The positive photosensitive resin compositions prepared in the Examples and the Comparative Examples were evaluated in terms of alkaline development performance, pattern formation ability, pattern linearity, shape maintenance capacity, total light transmittance, hue, and thermostability. The results were shown in Tables 1 and 2. The evaluation methods are described below.

[Alkaline Development Performance, Pattern Formation Ability, and Pattern Linearity]

The positive photosensitive resin compositions of Examples 1 to 10 and Comparative Examples 1 to 5 were each applied to a glass substrate having a size of 100 mm by 100 mm by 1 mm by bar coating so as to obtain a dry film thickness of about 3 μm. In addition, the positive photosensitive resin compositions of Examples 11 to 14 were each applied to a glass substrate having a size of 100 mm by 100 mm by 1 mm by bar coating so as to obtain a dry film thickness of about 1.5 μm. The coated substrates were dried at 120° C. for 80 seconds to remove solvent. Further, they were exposed to light at 100 mJ/cm$^2$ through a quartz photomask using an exposure device MULTI-LIGHT™ ML-251A/B, which was commercially available from Ushio Inc., equipped with an ultrahigh pressure mercury lamp. The exposure amount was determined using an accumulated UV meter UIT-150 having a detector of UVD-S365, which was commercially available from Ushio Inc. Each exposed coating film was treated for alkaline development with a 2.38% aqueous tetramethylammonium hydroxide solution for 60 seconds using a spin development apparatus AD-1200, which was commercially available from Takizawa Co., Ltd., thereby evaluating alkaline development performance. Residues after alkaline development was observed using an optical microscope VH-Z250, which was commercially available from Keyence Corporation. When there was no residue after alkaline development, it was judged as "Good." When there were residues, it was judged as "Not acceptable."

In addition, pattern formation ability was evaluated by measurement of pattern line width after alkaline development. Evaluation was carried out by confirming a site where the line width of a line-and-space pattern of the photomask was 10 μm, using an optical microscope VH-Z250, which was commercially available from Keyence Corporation. When the line width of a line-and-space pattern of the photomask after alkaline development indicates a line-to-space ratio of 1:1, it was judged as "Good." When the line width was within a range of ±10%, it was judged as "Acceptable." When the line width did not correspond to either thereof, it was judged as "Not acceptable." Thus, pattern formation ability was evaluated.

For evaluation of pattern linearity, a substantially linear pattern was judged as "Good," a slightly wavy pattern was judged as "Acceptable," and a pattern not corresponding to either thereof was judged as "Not acceptable."

[Shape Maintenance Capacity]

After a pattern was created in the manner described above, each glass substrate was placed on a hot plate heated to 150° C., and was left for 30 minutes. Thereafter, changes in the pattern shape and line width were evaluated using a stylus-type surface texture measuring instrument "SURFCOM 130A" which was commercially available from Tokyo Seimitsu Co., Ltd. When there were no changes in the both thereof after heating, it was judged as "Good." When a round pattern shape was formed, it was judged as "Acceptable." When a pattern did not correspond to either thereof, it was judged as "Not acceptable."

[Total Light Transmittance and Hue]

The positive photosensitive resin compositions of Examples 1 to 14 and Comparative Examples 1 to 5 were each applied to a glass substrate and dried as described above, further dried in a nitrogen gas atmosphere at 60° C. for 30 minutes, and cured by heating in a nitrogen gas at 250° C. for 60 minutes. The obtained coating films were used for measuring total light transmittance and hue in the L*a*b* color system by COH400 which was commercially available from Nippon Denshoku Industries Co., Ltd.

[Outgassing]

The positive photosensitive resin compositions of Examples 1 to 6, 9 to 10, and 12 to 14, and Comparative Examples 1 and 3 were each placed in an aluminum cup, dried in a nitrogen gas atmosphere at 60° C. for 30 minutes, and cured by heating in a nitrogen gas atmosphere at 250° C. for 60 minutes. The cured products were heated from room temperature to 300° C. at a temperature increase rate of 10° C./minute under a nitrogen stream and maintained at 300° C. for 90 minutes and then the weight loss (%) was measured by TG/DTA7200 which was commercially available from Hitachi High-Tech Science Corporation.

TABLE 1

| | | | | Example 1 | Example 2 | Example 3 | Example 4 | Example 5 |
|---|---|---|---|---|---|---|---|---|
| Formulation (parts by weight) | (A) Binder resin + (D) Solvent (γ-butyrolactone) | Component a | Resin solution a1 | 5 | 5 | 6.25 | 5 | 5 |
| | | Component b | Resin solution b1 | 5 | 1.25 | 13.75 | 2.5 | 1.25 |
| | | Component C | Resin solution c1 | 10 | 10 | 3.75 | 10 | 10 |
| | | | Resin solution c2 | — | — | — | — | — |
| | | Component d | Resin solution d1 | — | 2.5 | 3.75 | 12.5 | 2.5 |
| | | | Resin solution d2 | — | — | — | — | — |
| | | | Resin solution x1 | — | 1.25 | 2.5 | — | 1.25 |
| | | | Resin solution x2 | — | — | — | — | — |
| | | | Resin solution x3 | — | — | — | — | — |
| | | | Resin solution x4 | — | — | — | — | — |
| | | | Resin solution x5 | — | — | — | — | — |
| | (8) Quinonediazide compound | | TS-130A | 1 | 1 | 1 | 1 | 1 |
| | | | CNB-150 | — | — | — | — | — |
| | (C) Black dye | | VALIFAST BLACK 3830 | 0.17 | 0.17 | 0.17 | 0.17 | — |
| | | | VALIFAST BLACK 3804 | — | — | — | — | 0.15 |
| | | | VALIFAST BLACK 3810 | — | — | — | — | — |

TABLE 1-continued

|  |  |  |  |  |  |  |  |
|---|---|---|---|---|---|---|---|
|  | (C) Different Black dye | NUBIAN BLACK TN-870 | — | — | — | — | — |
|  |  | VALIFAST BLACK 1821 | — | — | — | — | — |
|  |  | Elixa Black 888 | — | — | — | — | — |
|  |  | ETAC | — | — | — | — | — |
|  |  | S-205 | — | — | — | — | — |
|  | (E) Surfactant | Surflon S-386 | 0.0075 | 0.0075 | 0.0075 | 0.0075 | 0.0075 |
| Composition ratio (parts by weight) | (A) Binder resin | Component a | 20 | 20 | 25 | 20 | 20 |
|  |  | Component b | 20 | 5 | 15 | 10 | 5 |
|  |  | Component c | 40 | 40 | 15 | 40 | 40 |
|  |  | Component d | — | 10 | 15 | 10 | 10 |
|  |  |  | 0 | 5 | 10 | 0 | 5 |
|  | (B) Quinonediazide compound |  | 20 | 20 | 20 | 20 | 20 |
|  | Black dye |  | 3.5 | 3.5 | 3.5 | 3.5 | 3.5 |
|  | (D) Solvent |  | 320 | 320 | 320 | 320 | 320 |
|  | (E) Additive |  | 0.15 | 0.15 | 0.15 | 0.15 | 0.15 |
| Results | Alkaline development performance |  | Good | Good | Good | Good | Good |
|  | Pattern formation ability |  | Acceptable | Good | Good | Acceptable | Good |
|  | Pattern linearity |  | Acceptable | Good | Acceptable | Acceptable | Good |
|  | Shape maintenance capacity |  | Acceptable | Acceptable | Good | Good | Acceptable |
|  | Total light transmittance |  | 45 | 42 | 47 | 44 | 35 |
|  | Hue | L* | 72 | 67 | 74 | 71 | 67 |
|  |  | a* | 1 | 1 | 1 | 0.8 | −0.7 |
|  |  | b* | 4.7 | 10 | 9.3 | 4 | 5.9 |
|  | Weight loss [%] |  | 5.3 | 6.7 | 6.5 | 5.9 | 6.7 |

|  |  |  |  | Example 6 | Example 7 | Example 8 | Example 9 | Example 10 |
|---|---|---|---|---|---|---|---|---|
| Formulation (parts by weight) | (A) Binder resin + (D) Solvent (γ-butyrolactone) | Component a | Resin solution a1 | 6.25 | 2.5 | — | — | — |
|  |  | Component b | Resin solution b1 | 3.75 | — | 1.25 | — | — |
|  |  | Component C | Resin solution c1 | 3.75 | — | — | 10 | — |
|  |  |  | Resin solution c2 | — | — | — | — | — |
|  |  | Component d | Resin solution d1 | 3.75 | — | — | — | — |
|  |  |  | Resin solution d2 | — | — | — | — | — |
|  |  |  | Resin solution x1 | 2.5 | — | — | — | — |
|  |  |  | Resin solution x2 | — | 12.5 | 18.75 | 10 | 5 |
|  |  |  | Resin solution x3 | — | 1.25 | — | — | — |
|  |  |  | Resin solution x4 | — | 3.75 | — | — | 13.75 |
|  |  |  | Resin solution x5 | — | — | — | — | 1.25 |
|  | (8) Quinonediazide compound |  | TS-130A | 1 | 1 | 1 | 1 | 1 |
|  |  |  | CNB-150 | — | — | — | — | — |
|  | (C) Black dye |  | VALIFAST BLACK 3830 | — | 0.17 | 0.17 | 0.17 | 0.17 |
|  |  |  | VALIFAST BLACK 3804 | — | — | — | — | — |
|  |  |  | VALIFAST BLACK 3810 | 0.15 | — | — | — | — |
|  | (C) Different Black dye |  | NUBIAN BLACK TN-870 | — | — | — | — | — |
|  |  |  | VALIFAST BLACK 1821 | — | — | — | — | — |
|  |  |  | Elixa Black 888 | — | — | — | — | — |
|  |  |  | ETAC | — | — | — | — | — |
|  |  |  | S-205 | — | — | — | — | — |
|  | (E) Surfactant |  | Surflon S-386 | 0.0075 | 0.0075 | 0.0075 | 0.0075 | 0.0075 |
| Composition ratio (parts by weight) | (A) Binder resin |  | Component a | 25 | 10 | 0 | 0 | 0 |
|  |  |  | Component b | 15 | 0 | 5 | 0 | 0 |
|  |  |  | Component c | 15 | 0 | 0 | 40 | 0 |
|  |  |  | Component d | 10 | 15 | 0 | 0 | 0 |
|  |  |  |  | 10 | 70 | 75 | 40 | 80 |
|  | (B) Quinonediazide compound |  |  | 20 | 20 | 20 | 20 | 20 |
|  | Black dye |  |  | 3.5 | 3.5 | 3.5 | 3.5 | 3.5 |
|  | (D) Solvent |  |  | 320 | 320 | 320 | 320 | 320 |
|  | (E) Additive |  |  | 0.15 | 0.15 | 0.15 | 0.15 | 0.15 |
| Results | Alkaline development performance |  |  | Good | Good | Good | Good | Good |
|  | Pattern formation ability |  |  | Good | Acceptable | Good | Good | Acceptable |
|  | Pattern linearity |  |  | Acceptable | Acceptable | Good | Good | Acceptable |
|  | Shape maintenance capacity |  |  | Good | Good | Acceptable | Acceptable | Good |
|  | Total light transmittance |  |  | 37 | 40 | 46 | 46 | 46 |
|  | Hue |  | L* | 67 | 70 | 73 | 73 | 73 |
|  |  |  | a* | 4 | 1.3 | 0.3 | 1.4 | 2.2 |
|  |  |  | b* | 9.7 | 8.8 | 8.9 | 8.3 | 5.7 |
|  | Weight loss [%] |  |  | 6.5 | * | * | 12 | 24 |

Symbol "*" indicates that measurement was not conducted.

TABLE 2

| | | | | Example 11 | Example 12 | Example 13 | Example 14 | Comparative Example 1 |
|---|---|---|---|---|---|---|---|---|
| Formulation (parts by weight) | (A) Binder resin + (D) Solvent (γ-butyrolactone) | Component a | Resin solution a1 | 5 | — | 2.5 | 2.5 | 5 |
| | | Component b | Resin solution b1 | 1.25 | — | — | — | 1.25 |
| | | Component C | Resin solution c1 | 10 | — | — | — | 10 |
| | | | Resin solution c2 | — | 9.5 | 17.5 | 15 | — |
| | | Component d | Resin solution d1 | 2.5 | — | — | 2.5 | 2.5 |
| | | | Resin solution d2 | — | 10 | — | — | — |
| | | | Resin solution x1 | 1.25 | — | — | — | 1.25 |
| | | | Resin solution x2 | — | — | — | — | — |
| | | | Resin solution x3 | — | — | — | — | — |
| | | | Resin solution x4 | — | — | — | — | — |
| | | | Resin solution x5 | — | — | — | — | — |
| | (8) Quinonediazide compound | | TS-130A | 1 | — | — | — | 1 |
| | | | CNB-150 | — | 1.1 | 1.0 | 1.0 | — |
| | (C) Black dye | | VALIFAST BLACK 3830 | 0.35 | — | — | — | — |
| | | | VALIFAST BLACK 3804 | — | 2.2 | 2.2 | 2.2 | — |
| | | | VALIFAST BLACK 3810 | — | — | — | — | — |
| | (C) Different Black dye | | NUBIAN BLACK TN-870 | — | — | — | — | 0.17 |
| | | | VALIFAST BLACK 1821 | — | — | — | — | — |
| | | | Elixa Black 888 | — | — | — | — | — |
| | | | ETAC | — | — | — | — | — |
| | | | S-205 | — | — | — | — | — |
| | (E) Surfactant | | Surflon S-386 | 0.0075 | 0.0075 | 0.0075 | 0.0075 | 0.0075 |
| Composition ratio (parts by weight) | (A) Binder resin | | Component a | 20 | 0 | 10 | 10 | 20 |
| | | | Component b | 5 | 0 | 0 | 0 | 5 |
| | | | Component c | 40 | 38 | 70 | 60 | 40 |
| | | | Component d | 10 | 40 | 0 | 10 | 10 |
| | | | | 5 | 0 | 0 | 0 | 5 |
| | (B) Quinonediazide compound | | | 20 | 22 | 20 | 20 | 20 |
| | Black dye | | | 7 | 44 | 44 | 44 | 3.5 |
| | (D) Solvent | | | 320 | 320 | 320 | 320 | 320 |
| | (E) Additive | | | 0.15 | 0.15 | 0.15 | 0.15 | 0.15 |
| Results | Alkaline development performance | | | Good | Good | Good | Good | Not acceptable |
| | Pattern formation ability | | | Good | Good | Good | Good | Not evaluable |
| | Pattern linearity | | | Good | Good | Good | Good | Not evaluable |
| | Shape maintenance capacity | | | Good | Good | Good | Good | Not evaluable |
| | Total light transmittance | | | 28 | 8.7 | 5.5 | 8.11 | 43 |
| | Hue | L* | | 67 | 31 | 28 | 34 | 72 |
| | | a* | | 0.8 | −3.7 | −3.2 | −0.4 | 0.9 |
| | | b* | | 4.7 | −15 | −15 | −15 | 26 |
| | Weight loss [%] | | | * | 5.2 | 4.4 | 4.6 | 7.7 |

| | | | | Comparative Example 2 | Comparative Example 3 | Comparative Example 4 | Comparative Example 5 |
|---|---|---|---|---|---|---|---|
| Formulation (parts by weight) | (A) Binder resin + (D) Solvent (γ-butyrolactone) | Component a | Resin solution a1 | 5 | 5 | 5 | 5 |
| | | Component b | Resin solution b1 | 1.25 | 1.25 | 1.25 | 1.25 |
| | | Component C | Resin solution c1 | 10 | 10 | 10 | 10 |
| | | | Resin solution c2 | — | — | — | — |
| | | Component d | Resin solution d1 | 2.5 | 2.5 | 2.5 | 2.5 |
| | | | Resin solution d2 | — | — | — | — |
| | | | Resin solution x1 | 1.25 | 1.25 | 1.25 | 1.25 |
| | | | Resin solution x2 | — | — | — | — |
| | | | Resin solution x3 | — | — | — | — |
| | | | Resin solution x4 | — | — | — | — |
| | | | Resin solution x5 | — | — | — | — |
| | (8) Quinonediazide compound | | TS-130A | 1 | 1 | 1 | 1 |
| | | | CNB-150 | — | — | — | — |
| | (C) Black dye | | VALIFAST BLACK 3830 | — | — | — | — |
| | | | VALIFAST BLACK 3804 | — | — | — | — |
| | | | VALIFAST BLACK 3810 | — | — | — | — |
| | (C) Different Black dye | | NUBIAN BLACK TN-870 | — | — | — | — |
| | | | VALIFAST BLACK 1821 | 0.17 | — | — | — |
| | | | Elixa Black 888 | — | 0.17 | — | — |
| | | | ETAC | — | — | 0.17 | — |
| | | | S-205 | — | — | — | 0.17 |
| | (E) Surfactant | | Surflon S-386 | 0.0075 | 0.0075 | 0.0075 | 0.0075 |
| Composition ratio (parts by weight) | (A) Binder resin | | Component a | 20 | 20 | 20 | 20 |
| | | | Component b | 5 | 5 | 5 | 5 |
| | | | Component c | 40 | 40 | 40 | 40 |
| | | | Component d | 10 | 10 | 10 | 10 |
| | | | | 5 | 5 | 5 | 5 |
| | (B) Quinonediazide compound | | | 20 | 20 | 20 | 20 |
| | Black dye | | | 3.5 | 3.5 | 3.5 | 3.5 |

TABLE 2-continued

| | | | | | |
|---|---|---|---|---|---|
| | (D) Solvent | 320 | 320 | 320 | 320 |
| | (E) Additive | 0.15 | 0.15 | 0.1.5 | 0.15 |
| Results | Alkaline development performance | Not acceptable | Good | Good | Not acceptable |
| | Pattern formation ability | Not evaluable | Good | Good | Not evaluable |
| | Pattern linearity | Not evaluable | Good | Good | Not evaluable |
| | Shape maintenance capacity | Not evaluable | Acceptable | Acceptable | Not evaluable |
| | Total light transmittance | 47 | 84 | 62 | 58 |
| Hue | L* | 74 | 93 | 83 | 82 |
| | a* | 0.9 | −1.3 | 0.5 | 3.3 |
| | b* | 17 | 21 | 17 | 18 |
| | Weight loss [%] | * | 6.1 | * | * |

Symbol "*" indicates that measurement was not conducted.

The results listed in the tables revealed that the prepared photosensitive resin compositions used in Examples 1 to 14 were excellent in terms of all items, i.e., radiation sensitivity (exposure sensitivity), pattern formation ability, pattern linearity, shape maintenance capacity, total light transmittance, and hue in a well-balanced manner. In particular, a significantly good light shielding function was achieved in all of the Examples. Meanwhile, in Comparative Example 1 in which an organic black dye was used, pattern formation was not achieved because development performance was significantly reduced, and hue did not fall within the range of black color. In addition, in Comparative Examples 4 and 5 in which the heat sensitive dye employed in Patent literature 2 was used, although each composition contained a compound having a phenol skeleton, a total light transmittance of less than 50% could not be obtained, and hue did not fall within the range of black color (the L* value is not more than 75, the a* value is from −15 to 15, and the b* value is from −15 to 15) as indicated in Patent literature 2.

INDUSTRIAL APPLICABILITY

The black positive photosensitive resin composition of the present invention can be preferably used for positive radiation lithography. An organic EL element comprising barrier ribs and an insulating film, which are formed from the black positive photosensitive resin composition of the present invention, is preferably used as an electronic part of a display unit that has good contrast.

The invention claimed is:

1. A positive photosensitive resin composition comprising a binder resin (A), a quinonediazide compound (B), and at least one black dye (C) selected from black dyes specified by a Colour Index of Solvent Black 27 to 47,
wherein the binder resin (A) comprises at least one selected from the group consisting of
(a) a polyalkenyl phenol resin having a structure represented by formula (1):

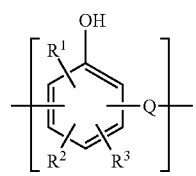

wherein $R^1$, $R^2$ and $R^3$ each independently represent a hydrogen atom, a $C_{1-5}$ alkyl group, an alkenyl group represented by formula (2):

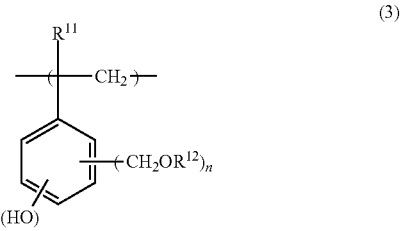

wherein $R^6$, $R^7$, $R^8$, $R^9$, and $R^{10}$ each independently represent a hydrogen atom, a $C_{1-5}$ alkyl group, a $C_{5-10}$ cycloalkyl group, or $C_{6-12}$ aryl group, and a symbol * in formula (2) represents a bond with a carbon atom that constitutes an aromatic ring,
a $C_{1-2}$ alkoxy group, or a hydroxyl group,
at least one of $R^1$, $R^2$ and $R^3$ is an alkenyl group represented by formula (2), and
Q represents an alkylene group represented by —$CR^4R^5$—, a $C_{5-10}$ cycloalkylene group, a divalent organic group having an aromatic ring, a divalent organic group having an alicyclic condensed ring, or a divalent group of any combination thereof, wherein $R^4$ and $R^5$ each independently represent a hydrogen atom, a $C_{1-5}$ alkyl group, a $C_{2-6}$ alkenyl group, a $C_{5-10}$ cycloalkyl group, or a $C_{6-12}$ aryl group;
(b) a hydroxy polystyrene resin derivative having a structural unit represented by formula (3):

$$\begin{array}{c} R^{11} \\ | \\ -(-CH_2-)- \\ \\ \phantom{xx}\text{—}(CH_2OR^{12})_n \\ \\ {}_m(HO) \end{array}$$

(3)

wherein $R^{11}$ represents a hydrogen atom or a $C_{1-5}$ alkyl group, m represents an integer of 1 to 4, n represents an integer of 1 to 4, m+n is from 2 to 5, $R^{12}$ represents at least one selected from the group consisting of a hydrogen atom, a methyl group, an ethyl group, and a propyl group; and
(c) an aqueous alkaline solution-soluble resin having an epoxy group and a phenolic hydroxyl group.

2. The positive photosensitive resin composition according to claim 1, wherein the black dye (C) is specified by a Colour Index of Solvent Black 27, 29, or 34.

3. The positive photosensitive resin composition according to claim 1, comprising from 40 to 85 parts by weight of the binder resin (A), from 5 to 45 parts by weight of the quinonediazide compound (B), and from 0.1 to 50 parts by weight of the black dye (C), based on 100 parts by weight in total of the binder resin (A), the quinonediazide compound (B), and the black dye (C).

4. The positive photosensitive resin composition according to claim 1, wherein a cured product of the positive photosensitive resin composition has a hue which corresponds to an L* value of not more than 75, an a* value of −15 to 15, and a b* value of −15 to 15 in the L*a*b* color system.

5. The positive photosensitive resin composition according to claim 1, wherein the binder resin (A) further comprises (d) an aqueous alkaline solution-soluble copolymer of a polymerizable monomer having an alkali-soluble functional group and another polymerizable monomer.

6. The positive photosensitive resin composition according to claim 5, wherein Q in formula (1) is —CH$_2$— for the polyalkenyl phenol resin (a), which means that formula (1) corresponds to formula (4):

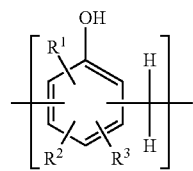

(4)

wherein R$^1$, R$^2$ and R$^3$ are the same as in formula (1).

7. The positive photosensitive resin composition according to claim 5, wherein the alkenyl group represented by formula (2) is an allyl group.

8. The positive photosensitive resin composition according to claim 5, wherein the hydroxy polystyrene resin derivative (b) is a copolymer having a structural unit represented by formula (3) and a structural unit represented by formula (5):

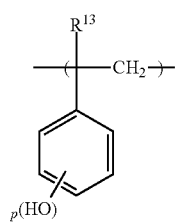

(5)

wherein R$^{13}$ represents a hydrogen atom or a C$_{1-5}$ alkyl group, and p represents an integer of 1 to 5.

9. The positive photosensitive resin composition according to claim 5, wherein the aqueous alkaline solution-soluble resin (c) having an epoxy group and a phenolic hydroxyl group is a reaction product of a compound having at least two epoxy groups in its molecule and a hydroxybenzoic acid, which is a compound having a structure represented by formula (8):

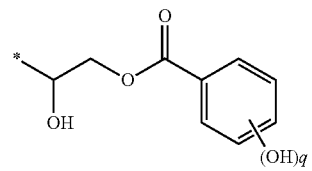

(8)

wherein q represents an integer of 1 to 5.

10. The positive photosensitive resin composition according to claim 9, wherein the compound having at least two epoxy groups in its molecule is a cresol novolac epoxy resin.

11. The positive photosensitive resin composition according to claim 9, wherein the hydroxybenzoic acid is dihydroxybenzoic acid.

12. The positive photosensitive resin composition according to claim 5, wherein the aqueous alkaline solution-soluble copolymer (d) of a polymerizable monomer having an alkali-soluble functional group and another polymerizable monomer has a structural unit represented by formula (10):

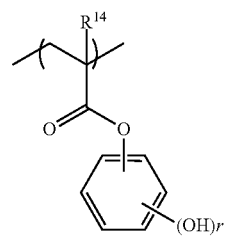

(10)

wherein R$^{14}$ represents a hydrogen atom or a C$_{1-5}$ alkyl group, and r represents an integer of 1 to 5,
and a structural unit represented by formula (11):

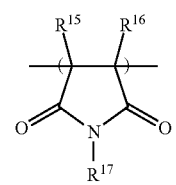

(11)

wherein R$^{15}$ and R$^{16}$ each independently represent a hydrogen atom, a C$_{1-3}$ alkyl group, a fully or partially fluorinated C$_{1-3}$ alkyl group, or a halogen atom, R$^{17}$ represents a hydrogen atom, a C$_{1-6}$ linear or cyclic alkyl group, a phenyl group, or a phenyl group substituted by at least one selected from the group consisting of a hydroxyl group, a C$_{1-6}$ alkyl group, and a C$_{1-6}$ alkoxy group.

13. The positive photosensitive resin composition according to claim 5, wherein the binder resin (A) comprises the aqueous alkaline solution-soluble resin (c) having an epoxy group and a phenolic hydroxyl group and the aqueous alkaline solution-soluble copolymer (d) of a polymerizable monomer having an alkali-soluble functional group and another polymerizable monomer.

14. A barrier rib of an organic EL element, comprising a cured product of the positive photosensitive resin composition according to claim 1.

15. An insulating film of an organic EL element, comprising a cured product of the positive photosensitive resin composition according to claim 1.

16. An organic EL element comprising a cured product of the positive photosensitive resin composition according to claim 1.

17. A method of producing a radiation lithography construct, comprising
(1) a coating step of dissolving the positive photosensitive resin composition according to claim 1 in a solvent and coating a base material therewith;
(2) a drying step of removing the solvent in the coating of the positive photosensitive resin composition;
(3) an exposure step of performing radiation irradiation through a photomask;
(4) a development step of forming a pattern by alkaline development; and
(5) a heat treatment step of heating at 100° C. to 350° C.

18. A positive photosensitive resin composition comprising a binder resin (A), a quinonediazide compound (B), and at least one black dye (C) selected from black dyes specified by a Colour Index of Solvent Black 27 to 47,
wherein the binder resin (A) comprises at least two selected from the group consisting of
(a) a polyalkenyl phenol resin having a structure represented by formula (1):

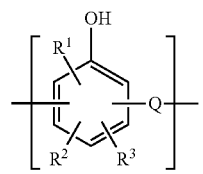

wherein $R^1$, $R^2$ and $R^3$ each independently represent a hydrogen atom, a $C_{1-5}$ alkyl group, an alkenyl group represented by formula (2):

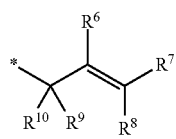

wherein $R^6$, $R^7$, $R^8$, $R^9$, and $R^{10}$ each independently represent a hydrogen atom, a $C_{1-5}$ alkyl group, a $C_{5-10}$ cycloalkyl group, or $C_{6-12}$ aryl group, and a symbol * in formula (2) represents a bond with a carbon atom that constitutes an aromatic ring,
a $C_{1-2}$ alkoxy group, or a hydroxyl group,
at least one of $R^1$, $R^2$ and $R^3$ is an alkenyl group represented by formula (2), and
Q represents an alkylene group represented by —$CR^4R^5$—, a $C_{5-10}$ cycloalkylene group, a divalent organic group having an aromatic ring, a divalent organic group having an alicyclic condensed ring, or a divalent group of any combination thereof, wherein $R^4$ and $R^5$ each independently represent a hydrogen atom, a $C_{1-5}$ alkyl group, a $C_{2-6}$ alkenyl group, a $C_{5-10}$ cycloalkyl group, or a $C_{6-12}$ aryl group;
(c) an aqueous alkaline solution-soluble resin having an epoxy group and a phenolic hydroxyl group; and
(d) an aqueous alkaline solution-soluble copolymer of a polymerizable monomer having an alkali-soluble functional group and another polymerizable monomer.

19. A positive photosensitive resin composition comprising a binder resin (A), a quinonediazide compound (B), and at least one black dye (C) selected from black dyes specified by a Colour Index of Solvent Black 27 to 47,
wherein the binder resin (A) comprises (d) an aqueous alkaline solution-soluble copolymer of a polymerizable monomer having an alkali-soluble functional group and another polymerizable monomer,
wherein the aqueous alkaline solution-soluble copolymer (d) of a polymerizable monomer having an alkali-soluble functional group and another polymerizable monomer has a structural unit represented by formula (10):

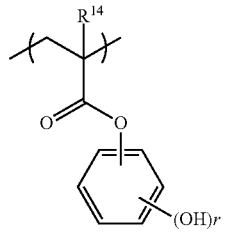

wherein $R^{14}$ represents a hydrogen atom or a $C_{1-5}$ alkyl group, and r represents an integer of 1 to 5,
and a structural unit represented by formula (11):

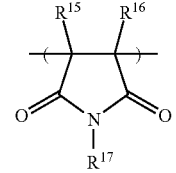

wherein $R^{15}$ and $R^{16}$ each independently represent a hydrogen atom, a $C_{1-3}$ alkyl group, a fully or partially fluorinated $C_{1-3}$ alkyl group, or a halogen atom, $R^{17}$ represents a hydrogen atom, a $C_{1-6}$ linear or cyclic alkyl group, a phenyl group, or a phenyl group substituted by at least one selected from the group consisting of a hydroxyl group, a $C_{1-6}$ alkyl group, and a $C_{1-6}$ alkoxy group.

* * * * *